(12) United States Patent
Choi et al.

(10) Patent No.: US 12,507,540 B2
(45) Date of Patent: Dec. 23, 2025

(54) DISPLAY DEVICE

(71) Applicant: Samsung Display Co., LTD., Yongin-si (KR)

(72) Inventors: Won Woo Choi, Yongin-si (KR); Jae Ik Lim, Yongin-si (KR); Yoon Ah Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 515 days.

(21) Appl. No.: 18/104,402

(22) Filed: Feb. 1, 2023

(65) Prior Publication Data

US 2023/0363212 A1 Nov. 9, 2023

(30) Foreign Application Priority Data

May 9, 2022 (KR) ........................ 10-2022-0056708

(51) Int. Cl.
*H10K 59/124* (2023.01)
*H10K 102/00* (2023.01)

(52) U.S. Cl.
CPC ..... *H10K 59/124* (2023.02); *H10K 2102/311* (2023.02)

(58) Field of Classification Search
CPC .......... H10K 59/124; H10K 2102/311; H10K 59/131; H10K 50/844; H10K 50/865; H10K 59/122; H10K 59/38; H10K 77/111; H10D 86/451
See application file for complete search history.

(56) References Cited

U.S. PATENT DOCUMENTS

| | | | | |
|---|---|---|---|---|
| 10,672,802 B2* | 6/2020 | Lee | .................... | H10K 59/131 |
| 11,013,108 B2* | 5/2021 | Kim | .................... | H05K 1/189 |
| 11,163,205 B1* | 11/2021 | Li | .................... | G02F 1/136286 |
| 11,653,546 B2* | 5/2023 | Lee | .................... | H10K 59/12 |
| | | | | 345/173 |
| 2016/0372701 A1* | 12/2016 | Kwon | .................... | G02B 27/286 |
| 2018/0074358 A1* | 3/2018 | Jeon | .................... | G02F 1/13338 |
| 2019/0165332 A1* | 5/2019 | Kwon | .................... | G09F 9/301 |
| 2019/0319215 A1* | 10/2019 | Lee | .................... | H10K 59/8722 |
| 2019/0326367 A1* | 10/2019 | Jung | .................... | G06V 40/13 |
| 2020/0119291 A1* | 4/2020 | Jeon | .................... | H10K 59/873 |
| 2020/0313117 A1 | 10/2020 | Xu et al. | | |
| 2020/0337161 A1* | 10/2020 | Choi | .................... | H10K 77/111 |

(Continued)

FOREIGN PATENT DOCUMENTS

| | | |
|---|---|---|
| KR | 10-2017-0127603 | 11/2017 |
| KR | 10-2018-0041775 | 4/2018 |

(Continued)

*Primary Examiner* — Douglas W Owens
(74) *Attorney, Agent, or Firm* — Innovation Counsel LLP

(57) ABSTRACT

A display device includes a display area and a non-display area, the non-display area including a bent area having a radius of curvature, a transistor layer disposed in the display area and including a transistor and a signal line and a stack of a plurality of first area organic layers disposed in the transistor layer. The bent area includes a line layer including a connection line and a stack of a plurality of second area organic layers disposed on the line layer, wherein the connection line is electrically connected to the signal line, wherein the plurality of second area organic layers respectively extends from the plurality of first area organic layers.

20 Claims, 27 Drawing Sheets

(56) References Cited

U.S. PATENT DOCUMENTS

| | | | |
|---|---|---|---|
| 2020/0388784 A1* | 12/2020 | Kim | H10K 59/121 |
| 2021/0249613 A1* | 8/2021 | Kwon | H10K 59/8731 |
| 2021/0257591 A1* | 8/2021 | Lee | H10K 59/123 |
| 2021/0327312 A1* | 10/2021 | Choi | G06F 1/1652 |
| 2021/0351384 A1* | 11/2021 | Lee | H10K 59/124 |
| 2021/0367206 A1 | 11/2021 | Li | |
| 2022/0005877 A1* | 1/2022 | Seo | H10K 71/135 |
| 2022/0165816 A1* | 5/2022 | Son | H10K 59/122 |
| 2022/0308624 A1* | 9/2022 | Gu | G06F 1/1656 |
| 2022/0320239 A1* | 10/2022 | Wei | G06F 3/04164 |
| 2022/0350445 A1* | 11/2022 | Bang | H10K 59/40 |
| 2022/0352485 A1* | 11/2022 | Shin | H10K 59/131 |
| 2023/0105026 A1* | 4/2023 | Park | H10K 71/00 257/88 |
| 2025/0221292 A1* | 7/2025 | Lee | H10K 77/111 |

FOREIGN PATENT DOCUMENTS

| | | |
|---|---|---|
| KR | 10-2019-0041252 | 4/2019 |
| KR | 10-2020-0108956 | 9/2020 |

\* cited by examiner

OFL: OF41, OF42, OF43, OF54, OF55, OF56, OF57

DISPLAY DEVICE

CROSS-REFERENCE TO RELATED APPLICATION

This application claims priority to and benefits of Korean Patent Application No. 10-2022-0056708 under 35 U.S.C. § 119, filed on May 9, 2022 in the Korean Intellectual Property Office (KIPO), the entire contents of which are incorporated herein by reference.

BACKGROUND

1. Technical Field

The disclosure relates to a display device.

2. Description of Related Art

As information society develops, demand for a flat panel display device for displaying an image is increasing in various forms. For example, the display device is being applied to various electronic devices such as smart phones, digital cameras, notebook computers, navigation devices, and smart televisions.

The display device is thin and light. Thus, a range of use thereof is expanding. Further, as the display device have recently become more flexible, the device is becoming more portable, and the number of fields to which the device is applied is increasing.

A flexible flat panel display device can be bent or folded. This is advantageous for reducing a size of the display device or improving visibility thereof at various angles. However, since the display device is thin, defects may easily occur in a manufacturing process thereof, a manufacturing cost thereof may be high, and a lifespan of the display device may be shortened due to stress caused by bending thereof.

SUMMARY

A purpose of the disclosure is to provide a display device in which a stack of organic layers of a display area of the display device extends into a bent area and a thickness of the extend stack extending into the bent area is controlled such that a neutral plane is positioned in a line layer in the bent area.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment, a display panel comprises a display area and a non-display area, the non-display area including a bent area having a radius of curvature, a transistor layer disposed in the display area and including a transistor and a signal line, and a stack of a plurality of first area organic layers disposed in the transistor layer.

The bent area includes a line layer including a connection line and a stack of a plurality of second area organic layers disposed on the line layer.

The connection line is electrically connected to the signal line.

The plurality of second area organic layers respectively extends from the plurality of first area organic layers.

The display device may further comprise a light-emitting element layer disposed on the transistor layer, a thin-film encapsulation layer disposed on the light-emitting element layer; and an overcoat layer disposed on the thin-film encapsulation layer.

The transistor layer may include an insulating layer and at least one organic planarization layer disposed on the insulating layer and respectively corresponding to at least one layer, and the plurality of first area organic layers may include the at least one organic planarization layer.

The light-emitting element layer may include a pixel defining layer and a spacer.

The plurality of first area organic layers may include at least one of the pixel defining layer or the spacer.

The plurality of first area organic layers may include the overcoat layer.

The display device may further comprise a color filter layer disposed between the thin-film encapsulation layer and the overcoat layer.

The color filter layer may include a first color filter transmitting light in a first wavelength range, a second color filter transmitting light in a second wavelength range, and a third color filter transmitting light in a third wavelength range.

The display device may further comprise a light-blocking member disposed under the color filter layer. The light-blocking member may include an organic insulating material including at least one of black resin or white resin.

The neutral plane may be located in the line layer.

The stack of the plurality of second area organic layers may have a thickness in a range of about 10 μm to about 12 μm.

Each of the plurality of second area organic layers may have a plurality of patterns.

The plurality of patterns may be arranged in a linear manner, a diagonal manner, and/or a checkerboard manner in a plan view of the device.

Each of the plurality of second area organic layers may have a through-hole between adjacent ones of the plurality of patterns.

The plurality of second area organic layers may include a first organic layer, a second organic layer disposed on the first organic layer, and a third organic layer disposed on the second organic layer.

The first organic layer may have a plurality of patterns, and have a first through-hole formed between adjacent ones of the plurality of patterns of the first organic layer, and a second through-hole between adjacent ones of the plurality of patterns of the first organic layer.

The second organic layer may have a plurality of patterns, and have a third through-hole formed between adjacent ones of the plurality of patterns of the second organic layer.

The first through-hole may not overlap the third through-hole.

The first through-hole may be filled with the second organic layer.

The second through-hole may overlap the third through-hole.

The second through-hole and the third through-hole may be filled with the third organic layer.

A display device comprises a display area and a non-display area, the non-display area including a bent area having a radius of curvature, a transistor layer disposed in the display area and including a transistor and a signal line, a light-emitting element layer disposed on the transistor layer, a thin-film encapsulation layer disposed on the light-emitting element layer, and an overcoat layer disposed on the thin-film encapsulation layer.

The bent area includes a line layer including a connection line and a stack of a plurality of organic layers disposed on the line layer.

The plurality of organic layers respectively extend from at least two of the transistor layer, the light-emitting element layer, the thin-film encapsulation layer or the overcoat layer.

The display device may further comprise a color filter layer disposed between the thin-film encapsulation layer and the overcoat layer. The color filter layer includes an organic insulating material including at least one of black resin and white resin.

The neutral plane may be located in the line layer.

Wherein each of the plurality of organic layers may gave a plurality of patterns.

According to an embodiment, there is no need to perform a process of forming a bending protective layer for controlling the position of the neutral plane of the bending region of the display device. Accordingly, the number of manufacturing processes of the display device can be reduced.

However, the effects of the disclosure are not limited to the aforementioned effects, and various other effects are included in the specification.

BRIEF DESCRIPTION OF DRAWINGS

The above and other aspects and features of the disclosure will become more apparent by describing in detail illustrative embodiments thereof with reference to the attached drawings, in which.

DETAILED DESCRIPTIONS OF THE EMBODIMENTS

Figure 1:
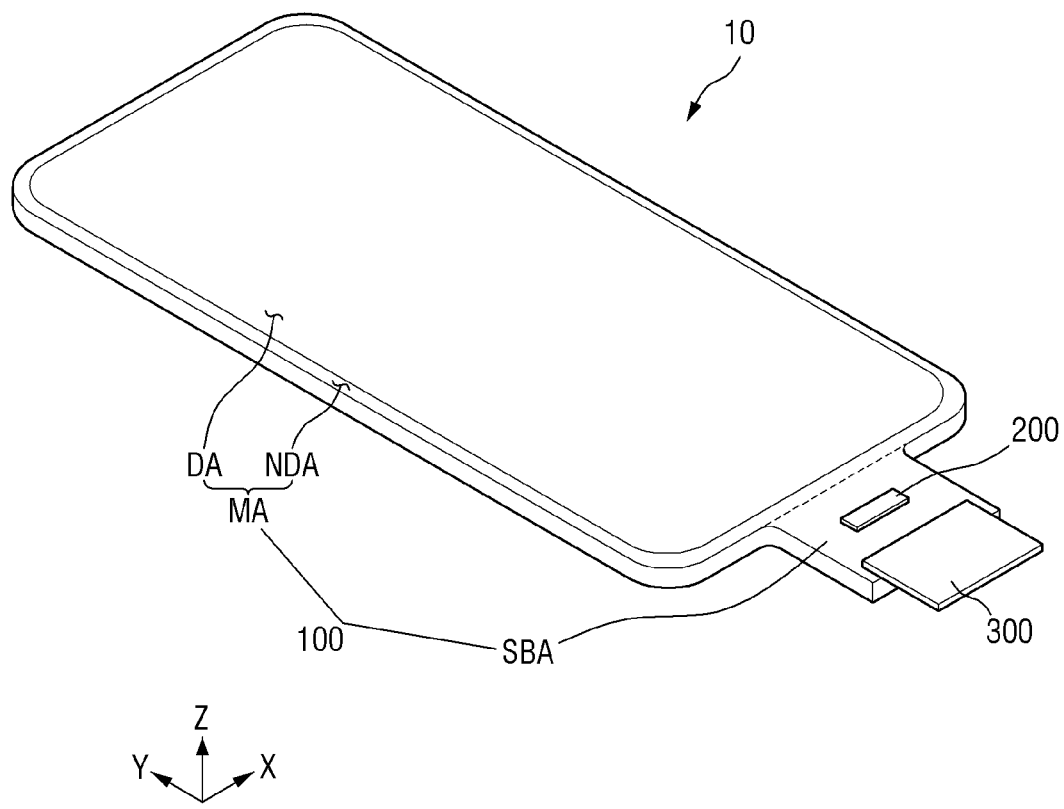
FIG. 1 is a schematic perspective view illustrating a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," "on," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within 30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic perspective view illustrating a display device according to an embodiment.

Referring to FIG. 1, a display device 10 according to an embodiment may be applied to a portable electronic device such as a mobile phone, a smartphone, a tablet PC (tablet personal computer), a mobile communication terminal, an electronic notebook, an electronic book, PMP (portable multimedia player), a navigation system, and an UMPC (Ultra Mobile PC). As another example, the display device 10 according to an embodiment may be applied as a display unit of a television, a laptop computer, a monitor, a billboard, or an Internet of Things (IoT) device. As another example, the display device 10 according to an embodiment may be applied to a wearable device such as a smartwatch, a watch phone, a glasses type display, and a head-mounted display (HMD). As another example, the display device 10 according to an embodiment may be applied to a vehicle's dashboard, a center fascia of the vehicle, a CID (Center Information Display) disposed on the dashboard of the vehicle, a room mirror display that replaces a side-view mirror of the vehicle, or a display disposed on a back face of a front seat as an entertainment device for a rear seat of the vehicle.

The display device 10 may be a light-emitting display device embodied as an organic light-emitting display device using an organic light-emitting diode, a quantum dot light-emitting display device including a quantum dot light-emitting layer, an inorganic light-emitting display device including an inorganic semiconductor, or a micro light-emitting display device using a micro or nano light-emitting diode (micro LED or nano LED). Hereinafter, an example in which the display device 10 is embodied as the organic light-emitting display device will be described. However, the disclosure is not limited thereto.

The display device 10 may include a display panel 100, a display driving circuit 200, and a display circuit board 300.

The display panel 100 may have a rectangular planar shape with a short side extending in a first direction (X-axis direction) and a long side extending in a second direction (Y-axis direction) intersecting the first direction (X-axis direction). A corner where the short side extending in the first direction (X-axis direction) and the long side extending in the second direction (Y-axis direction) meet each other may be rounded to have a curvature (e.g., a predetermined or selectable curvature) or may be formed at a right angle. A planar shape of the display panel 100 is not limited to a quadrangle, and may have other polygons, a circle, or an oval. The display panel 100 may be formed in a flat manner. However, the disclosure is not limited thereto. For example, the display panel 100 may include a curved portion formed on each of left and right ends thereof, and having a constant curvature or a varying curvature. The display panel 100 may be flexibly formed so as to be bent, folded, or rolled.

The display panel 100 may include a main area MA and a sub-area SBA.

The main area MA may include a display area DA that displays an image and a non-display area NDA as a peripheral area around the display area DA. The sub-area SBA may protrude from a side of the main area MA in the second direction (Y-axis direction).

FIG. 1 illustrates that the sub-area SBA is unfolded. However, the sub-area SBA may be bent, and the sub-area SBA may be disposed on a bottom face of the display panel 100. In case that the sub-area SBA is bent, the sub-area SBA may overlap the main area MA in a thickness direction (Z-axis direction) of a substrate SUB. The display driving circuit 200 may be disposed in the sub-area SBA.

The display driving circuit 200 may generate signals and voltages for driving the display panel 100. The display driving circuit 200 may be embodied as an integrated circuit (IC) and may be attached to the display panel 100 in a COG (chip-on-glass) scheme, a COP (chip-on-plastic) scheme, or an ultrasonic bonding scheme. However, the disclosure is not limited thereto. For example, the display driving circuit 200 may be attached on the circuit board 300 in a COF (chip-on-film) scheme.

The circuit board 300 may be attached to an end of the sub-area SBA of the display panel 100. Thus, the circuit board 300 may be electrically connected to the display panel 100 and the display driving circuit 200. The display panel 100 and the display driving circuit 200 may receive digital video data, timing signals, and driving voltages via the circuit board 300. The circuit board 300 may be embodied as a flexible printed circuit board, a printed circuit board or a flexible film such as a chip-on-film.

Figure 2:
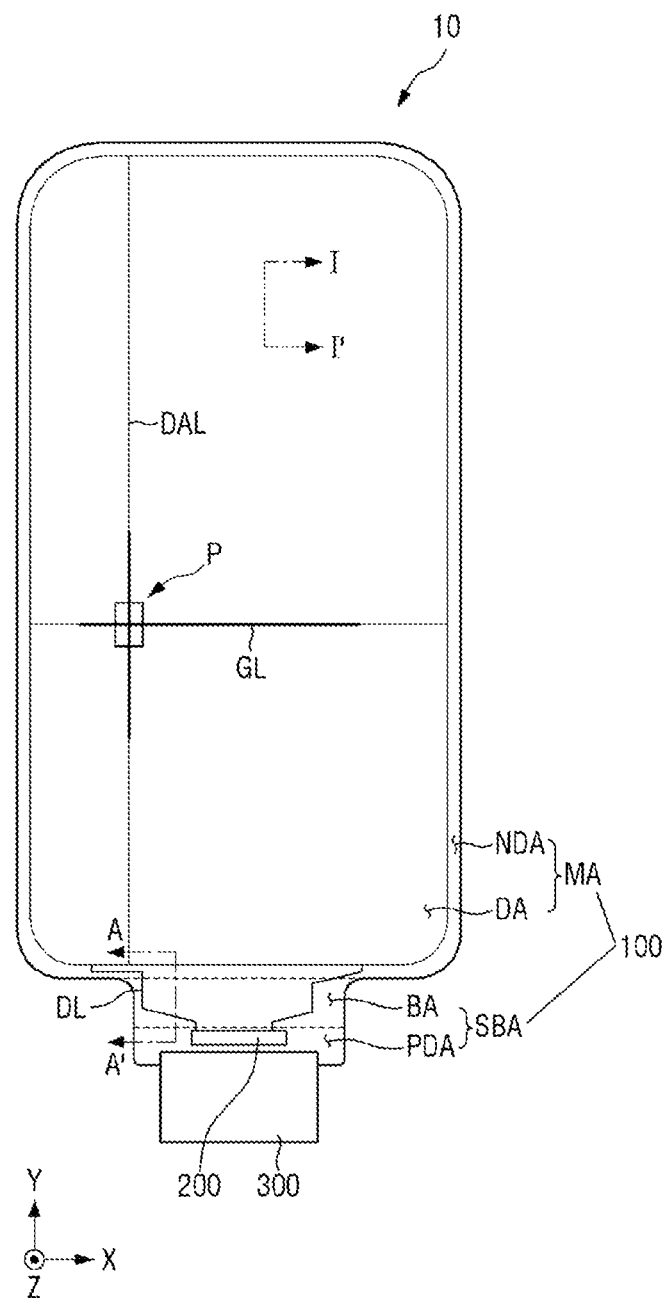
FIG. 2 and FIG. 3 are schematic plan views illustrating a display device according to an embodiment.
Figure 3:
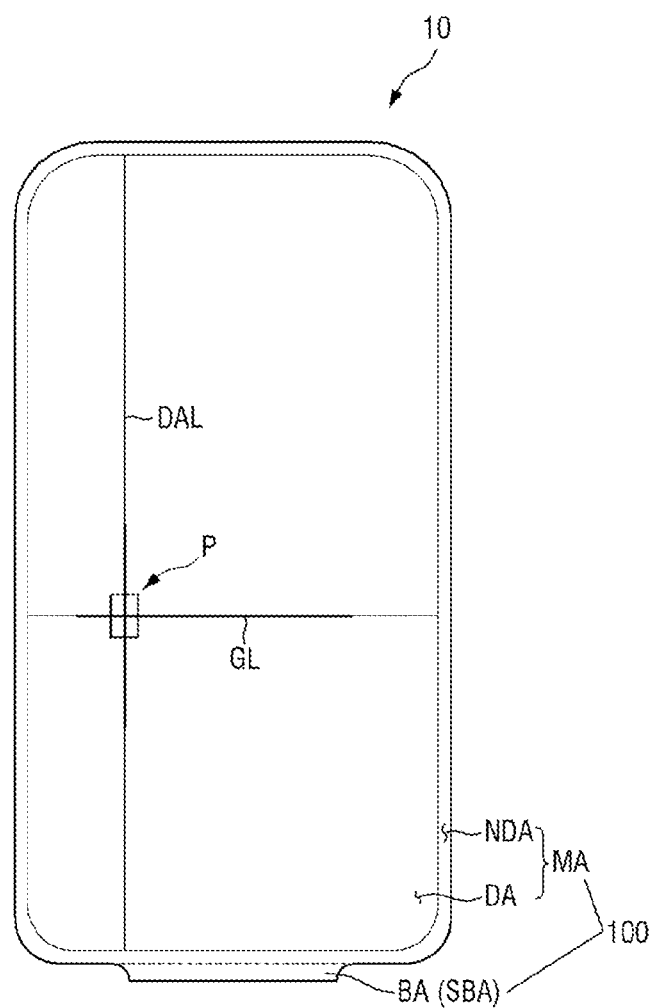
Figure 4:
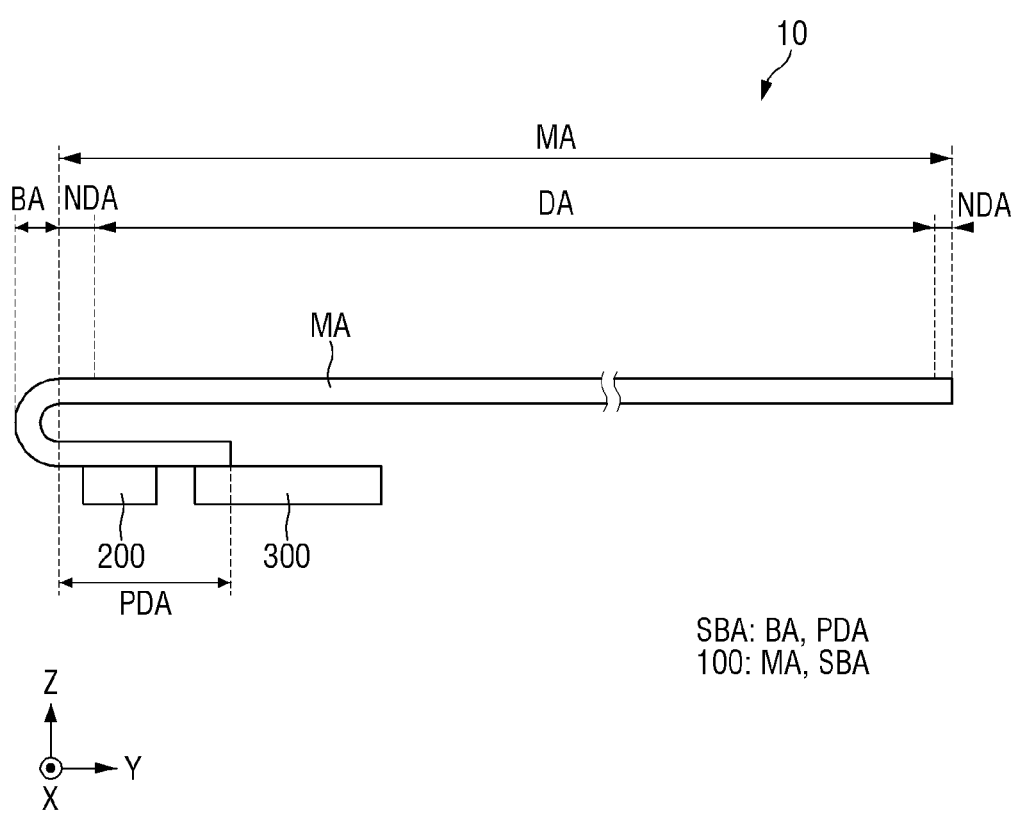
FIG. 4 is a schematic side view illustrating a display device according to an embodiment.

FIGS. 2 and 3 are schematic plan views illustrating the display device according to an embodiment. FIG. 4 is a schematic side view illustrating a display device according to an embodiment.

FIG. 2 illustrates a state in which the sub-area SBA is not bent but is unfolded. FIGS. 3 and 4 illustrate a state in which the sub-area SBA is bent.

Referring to FIGS. 2 to 4, the display panel 100 may include the main area MA and the sub-area SBA.

The main area MA may include a display area DA that displays an image and a non-display area NDA as a peripheral area around the display area DA. The display area DA may occupy a substantial portion of the main area MA. The display area DA may be disposed in an inner area of the main area MA.

The display area DA may include pixels P that display the image, and a signal line. The signal line may include a gate line GL for transmitting a gate signal, a data line DAL for transmitting a data signal, a driving power line, and a common power line. A pixel may be achieved by an electrical combination between a thin-film transistor and a light-emitting element electrically connected to the gate line, the data line, the driving power line, and the common power line, and thus may display an image. The pixel P may emit light at a luminance corresponding to driving current through the organic light-emitting element in response to the data signal and according to driving power and common power supplied to the pixel P.

The non-display area NDA may be disposed adjacent to the display area DA. The non-display area NDA may be an area outside the display area DA. The non-display area NDA may be disposed to surround the display area DA. The non-display area NDA may be an edge area of the display panel 100.

The sub-area SBA may protrude from a side of the main area MA in the second direction (Y-axis direction). A length in the second direction (Y-axis direction) of the sub-area SBA may be smaller than a length in the second direction (Y-axis direction) of the main area MA. A length in the first direction (X-axis direction) of the sub-area SBA may be smaller than a length in the first direction (X-axis direction) of the main area MA, or may be substantially equal to the length in the first direction (X-axis direction) of the main area MA. The sub-area SBA may be bent so as to be disposed on a rear face of the display panel 100. The sub-area SBA may overlap the main area MA in the third direction (Z-axis direction).

The sub-area SBA may include a bent area BA and a pad area PDA.

The bent area BA is an area that protrudes in the second direction (Y-axis direction) from a side of the main area MA and is bent. A side of the bent area BA may contact the non-display area NDA of the main area MA, while another side of the bent area BA may contact the pad area PDA. In case that the bent area BA is bent, the pad area PDA may be disposed under the main area MA.

A connection line DL may be disposed in the bent area BA. The connection line DL may extend from the signal lines of the main area MA and may be electrically connected to display pads of the pad area PDA.

The connection line DL may overlap the bent area BA. The connection line DL extends from the main area MA through the bent area BA to the pad area PDA. The connection line DL may have various shapes such as a curved shape, a diagonal shape, and a zigzag shape as well as a straight shape.

The pad area PDA is an area in which the display pads and the display driving circuit 200 are disposed. The display pad may be exposed while not being covered with an insulating layer, and thus may be electrically connected to a controller such as the circuit board 300. The controller provides the data signal, the gate signal, the driving voltage, the common voltage, and the like to the pixel P.

The display driving circuit 200 may be attached to driving pads using an anisotropic conductive film or a low-resistance and high-reliability material such as SAP (Self Assembly Anisotropic Conductive Paste). The circuit board 300 may be attached to the display pads of the pad area PDA using an anisotropic conductive film or a low-resistance and high-reliability material such as SAP. A side of the pad area PDA may contact the bent area BA.

Figure 5:
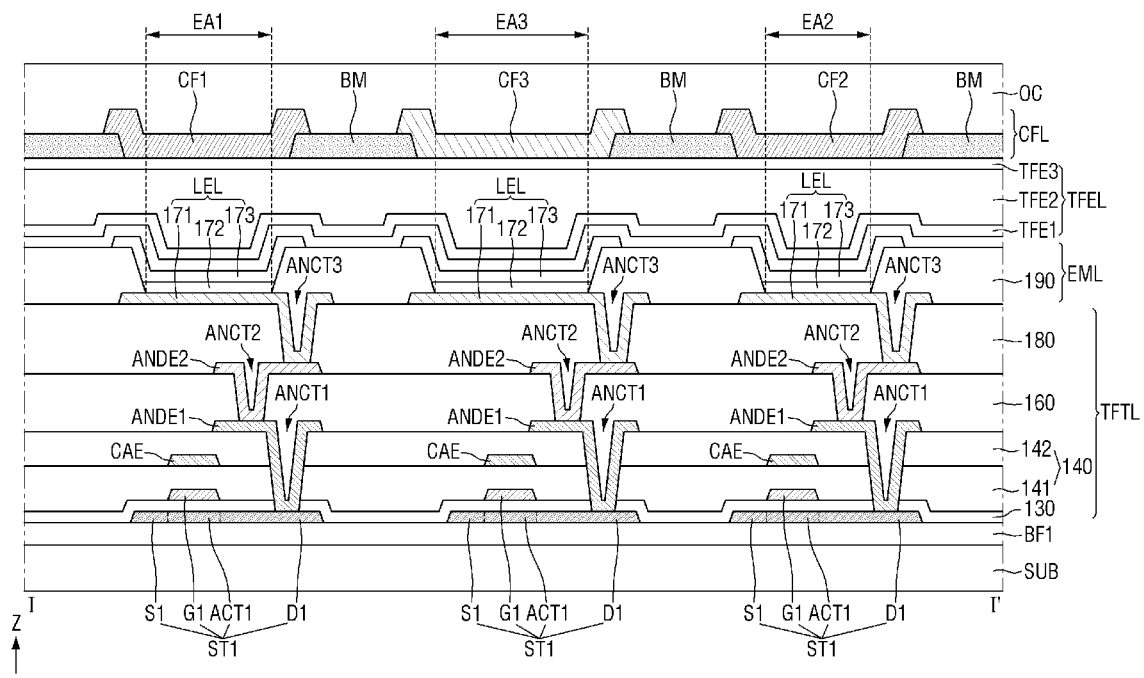
FIG. 5 is a schematic cross-sectional view illustrating an example of a display panel cut along I-I' in FIG. 2.

FIG. 5 is a schematic cross-sectional view illustrating an example of the display panel cut along I-I' in FIG. 2.

Referring to FIG. 5, the display panel 100 may include the substrate SUB, a thin-film transistor layer TFTL, a light-emitting element layer EML, an encapsulation layer or thin-film encapsulation layer TFEL (hereinafter, "thin-film encapsulation layer") and a color filter layer CFL.

A first buffer layer BF1 may be disposed on the substrate SUB. The substrate SUB may be made of an insulating material such as polymer resin. For example, the substrate SUB may be made of polyimide. The substrate SUB may be embodied as a flexible substrate which may be rollable, bendable, or foldable.

The first buffer layer BF1 may act to protect transistors ST1 of the thin-film transistor layer TFTL and a light-emitting layer 172 of the light-emitting element layer EML from moisture penetrating through the substrate SUB which is vulnerable to moisture permeation. The first buffer layer BF1 may be composed of (or include) inorganic layers alternately stacked with each other. For example, the first buffer layer BF1 may be embodied as a stack in which at least two inorganic layers are alternately stacked with each other, for example, at least two of a silicon nitride layer, a silicon oxynitride layer, a silicon oxide layer, a titanium oxide layer, and an aluminum oxide layer are alternately stacked with each other.

The thin-film transistor layer TFTL may be disposed on the first buffer layer BF1.

The thin-film transistor layer TFTL may include the transistor ST1, a gate insulating layer 130, an interlayer insulating layer 140, a first planarization layer 160, and a second planarization layer 180.

The transistor ST1 may include an active layer ACT1, a gate electrode G1, a source electrode S1, and a drain electrode D1.

The active layer ACT1, the source electrode S1, and the drain electrode D1 of the transistor ST1 may be disposed on the first buffer layer BF1. The active layer ACT1 of the transistor ST1 may include polycrystalline silicon, single crystal silicon, low temperature polycrystalline silicon, amorphous silicon, and/or oxide semiconductor. The active layer ACT1 overlapping the gate electrode G1 in the third direction (Z-axis direction) as the thickness direction of the substrate SUB may be defined as a channel area. The source electrode S1 and the drain electrode D1 may not overlap the gate electrode G1 in the third direction (Z-axis direction), and may be achieved by doping a silicon semiconductor or an oxide semiconductor with ions or impurities and thus may be conductive.

The gate insulating layer 130 may be disposed on the active layer ACT1, the source electrode S1, and the drain electrode D1 of the transistor ST1. The gate insulating layer 130 may be embodied as an inorganic layer, for example, a silicon nitride layer, a silicon oxynitride layer, a silicon oxide layer, a titanium oxide layer, and/or an aluminum oxide layer.

The gate electrode G1 of the transistor ST1 may be disposed on the gate insulating layer 130. The gate electrode G1 may overlap the active layer ACT1 in the third direction (Z-axis direction). The gate electrode G1 may be composed of a single layer made of (or including) at least one of molybdenum (Mo), aluminum (Al), chromium (Cr), gold (Au), titanium (Ti), nickel (Ni), neodymium (Nd), and copper (Cu), or an alloy thereof, or multiple layers made thereof.

A first interlayer insulating layer 141 may be disposed on the gate electrode G1 of the transistor ST1. The first interlayer insulating layer 141 may be embodied as an inorganic layer, for example, a silicon nitride layer, a silicon oxynitride layer, a silicon oxide layer, a titanium oxide layer, or an aluminum oxide layer. The first interlayer insulating layer 141 may be composed of inorganic layers.

A capacitor electrode CAE may be disposed on the first interlayer insulating layer 141. The capacitor electrode CAE may overlap the gate electrode G1 of the first transistor ST1 in the third direction (Z-axis direction). Since the first interlayer insulating layer 141 has a dielectric constant (e.g., a predetermined or selectable a dielectric constant), a capacitor may be composed of the capacitor electrode CAE, the gate electrode G1, and the first interlayer insulating layer 141 disposed therebetween. The capacitor electrode CAE may be composed of a single layer made of at least one of molybdenum (Mo), aluminum (Al), chromium (Cr), gold (Au), titanium (Ti), nickel (Ni), neodymium (Nd) and copper (Cu), or an alloy thereof or multiple layers made thereof.

A second interlayer insulating layer 142 may be disposed on the capacitor electrode CAE. The second interlayer insulating layer 142 may be embodied as an inorganic layer, for example, a silicon nitride layer, a silicon oxynitride layer, a silicon oxide layer, a titanium oxide layer, or an aluminum oxide layer. The second interlayer insulating layer 142 may be composed of inorganic layers.

A first anode connection electrode ANDE1 may be disposed on the second interlayer insulating layer 142. The first anode connection electrode ANDE1 may be connected to the drain electrode D1 of the transistor ST1 via a first connection contact hole ANCT1 extending through the gate insulating layer 130, the first interlayer insulating layer 141, and the second interlayer insulating layer 142. The first anode connection electrode ANDE1 may be composed of a single layer made of at least one of molybdenum (Mo), aluminum (Al), chromium (Cr), gold (Au), titanium (Ti), nickel (Ni), neodymium (Nd), and copper (Cu) or an alloy thereof or multiple layers made thereof.

The first planarization layer 160 may be disposed on the first anode connection electrode ANDE1 so as to perform planarization of a step caused by the transistor ST1. The first planarization layer 160 may be embodied as an organic layer made of, for example, acryl resin, epoxy resin, phenolic resin, polyamide resin, or polyimide resin.

A second anode connection electrode ANDE2 may be disposed on the first planarization layer 160. The second anode connection electrode ANDE2 may be electrically connected to the first anode connection electrode ANDE1 via a second connection contact hole ANCT2 extending through the first planarization layer 160. The second anode connection electrode ANDE2 may be composed of a single layer made of at least one of molybdenum (Mo), aluminum (Al), chromium (Cr), gold (Au), titanium (Ti), nickel (Ni), neodymium (Nd) and copper (Cu), or an alloy thereof or multiple layers made thereof The second planarization layer 180 may be disposed on the second anode connection electrode ANDE2. The second planarization layer 180 may be embodied as an organic layer made of, for example, acryl resin, epoxy resin, phenolic resin, polyamide resin, and/or polyimide resin.

The light-emitting element layer EML may be disposed on the thin-film transistor layer TFTL. The light-emitting element layer EML may include light-emitting elements LEL.

The light-emitting element LEL and a bank 190 may be disposed on the second planarization layer 180 of the thin-film transistor layer TFTL. Each of the light-emitting elements LEL may include a pixel electrode 171, a light-emitting layer 172, and a common electrode 173.

A pixel electrode 171 may be disposed on the second planarization layer 180. The pixel electrode 171 may be connected to the second anode connection electrode ANDE2 via a third connection contact hole ANCT3 extending through the second planarization layer 180.

In a top emission structure in which the device emits light in a direction from the light-emitting layer 172 to the common electrode 173, the pixel electrode 171 may be composed of a highly-reflective metal material such as a stack structure of aluminum and titanium (Ti/Al/Ti), or a stack structure of aluminum and ITO (indium tin oxide) (ITO/Al/ITO), or an APC alloy, or a stack structure of the APC alloy and ITO (ITO/APC/ITO). The APC alloy refers to an alloy of silver (Ag), palladium (Pd), and copper (Cu).

The bank 190 may be formed on the second planarization layer 180 so as to partition the pixel electrode 171 to define a light-emitting element. The bank 190 may be disposed to cover an edge of the pixel electrode 171. The bank 190 may be embodied as an organic layer made of, for example, acryl resin, epoxy resin, phenolic resin, polyamide resin, and/or polyimide resin.

The light-emitting element may be composed of the pixel electrode 171, the light-emitting layer 172, and the common electrode 173 which are sequentially stacked with each other. In this light-emitting element, holes from the pixel electrode 171 and electrons from the common electrode 173 may combine with each other in the light-emitting layer 172 to emit light.

The light-emitting layer 172 may be disposed on the pixel electrode 171 and the bank 190. The light-emitting layer 172 may include an organic material and may emit light of a color (e.g., a predetermined or selectable color). For example, the light-emitting layer 172 may include a hole transporting layer, an organic layer, and an electron transporting layer.

The common electrode 173 may be disposed on the light-emitting layer 172. The common electrode 173 may be disposed to cover the light-emitting layer 172. The common electrode 173 may be a common layer commonly disposed in and across light-emitting elements LEL. A capping layer may be formed on the common electrode 173.

In the top-emission structure, the common electrode 173 may be made of a transparent conductive material (TCO) such as ITO or IZO that may transmit light therethrough, or a semi-transmissive conductive material such as magnesium (Mg), silver (Ag), or an alloy of magnesium (Mg) and silver (Ag). In case that the common electrode 173 is made of the semi-transmissive conductive material, light output efficiency may be increased due to a micro cavity.

The thin-film encapsulation layer TFEL may be disposed on the light-emitting element layer EML. The thin-film encapsulation layer TFEL may include at least one organic layer to protect the light-emitting element layer EML from foreign material such as dust. For example, the thin-film encapsulation layer TFEL may include a first encapsulation inorganic layer TFE1, an encapsulation organic layer TFE2, and a second encapsulation inorganic layer TFE3.

The first encapsulation inorganic layer TFE1 may be disposed on the common electrode 173, the encapsulation organic layer TFE2 may be disposed on the first encapsulation inorganic layer TFE1, and the third encapsulation inorganic layer TFE3 may be disposed on the encapsulation organic layer TFE2. Each of the first encapsulation inorganic layer TFE1 and the second encapsulation inorganic layer TFE2 may be composed of a stack of multiple layers in which at least two inorganic layers, for example, at least two of a silicon nitride layer, a silicon oxynitride layer, a silicon oxide layer, a titanium oxide layer, and an aluminum oxide layer are alternately stacked with each other. The encapsulation organic layer TFE2 may be embodied as an organic layer made of, for example, acryl resin, epoxy resin, phenolic resin, polyamide resin, and/or polyimide resin.

A color filter layer CFL may be disposed on the thin-film encapsulation layer TFEL. The color filter layer CFL may include a light-blocking member BM and color filters CF1, CF2, and CF3.

The color filter layer CFL may be an organic pattern (or organic material pattern) containing dyes or pigments. The color filter layer CFL may include color filters CF1, CF2, and CF3. For example, the color filter layer CFL may include a first color filter to transmit light in a first wavelength range therethrough, a second color filter to transmit light in a second wavelength range therethrough, and a third color filter to transmit light in a third wavelength range therethrough.

The color filters CF1, CF2, and CF3 may respectively overlap light-emitting elements EA1, EA2, and EA3 of each pixel.

Each of the pixels may include a first light-emitting element EA1 emitting light of a first color, a second light-emitting element EA2 emitting light of a second color, and a third light-emitting element EA3 emitting light of a third color. For example, the first color may be red, the second color may be green, and the third color may be blue.

The first color filter CF1 may overlap the first light-emitting element EA1 in the third direction (Z-axis direction). The first color filter CF1 may not overlap the second light-emitting element EA2 and the third light-emitting element EA3 in the third direction (Z-axis direction). Accordingly, the first color light emitted from the first light-emitting element EA1 may be output through the first color filter CF1.

The second color filter CF2 may overlap the second light-emitting element EA2 in the third direction (Z-axis direction). The second color filter CF2 may not overlap the first light-emitting element EA1 and the third light-emitting element EA3 in the third direction (Z-axis direction). Accordingly, the second color light emitted from the second light-emitting element EA2 may be output through the second color filter CF2.

The third color filter CF3 may overlap the third light-emitting element EA3 in the third direction (Z-axis direction). The third color filter CF3 may not overlap the first light-emitting element EA1 and the second light-emitting element EA2 in the third direction (Z-axis direction). Accordingly, the third color light emitted from the third light-emitting element EA3 may be output through the third color filter CF3.

The light-blocking member BM may be disposed between two adjacent to each other in a horizontal direction of the plurality of color filters CF1, CF2, and CF3.

The light-blocking member BM may have a variety of colors including black or white. In case that the light-blocking member BM is black, the light-blocking member BM may include a black matrix. In case that the light-blocking member BM is white, the light-blocking member BM may include an organic insulating material such as white resin. The light-blocking member BM may include an opaque organic insulating material such as black resin.

The light-blocking member BM may prevent a portion of the light emitted from the light-emitting element LEL to be incident on the color filter layer CFL of a pixel adjacent thereto.

An overcoat layer OC may be disposed on the color filter layer CFL. The overcoat layer OC may be embodied as an organic layer made of, for example, acryl resin, epoxy resin, phenolic resin, polyamide resin, and/or polyimide resin.

A cover window to protect a top of the display panel 100 may be disposed on the overcoat layer OC. The cover window may be attached on the color filter layer CFL using a transparent adhesive member such as an OCA (optically clear adhesive) film or OCR (optically clear resin). The cover window may be made of an inorganic material such as glass, or an organic material such as a plastic or polymer material.

Figure 6:
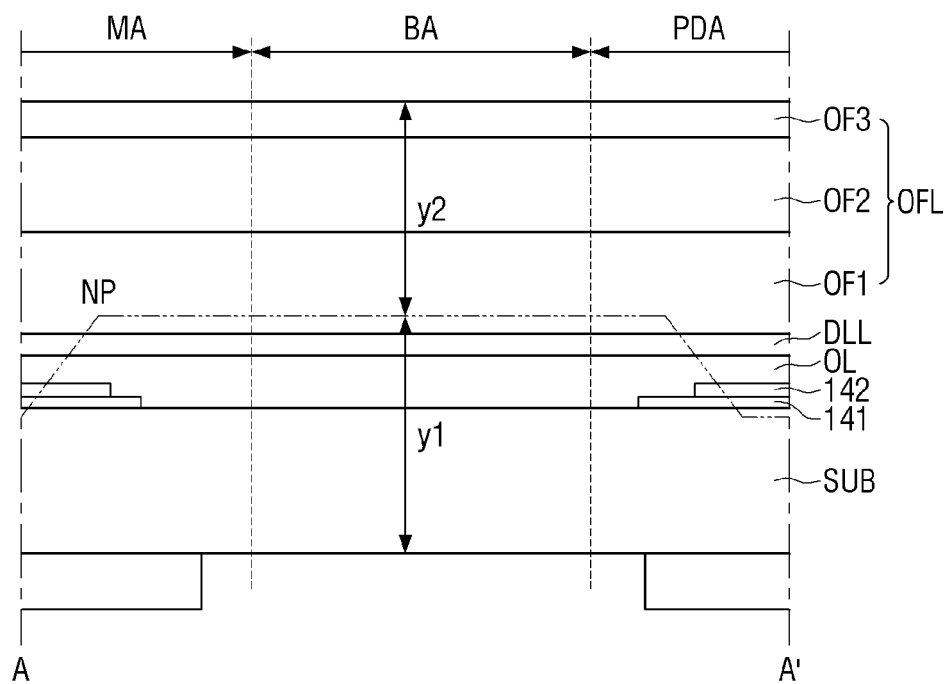
FIG. 6 is a schematic cross-sectional view illustrating an example of a display panel cut along A-A' in FIG. 2.
Figure 7:
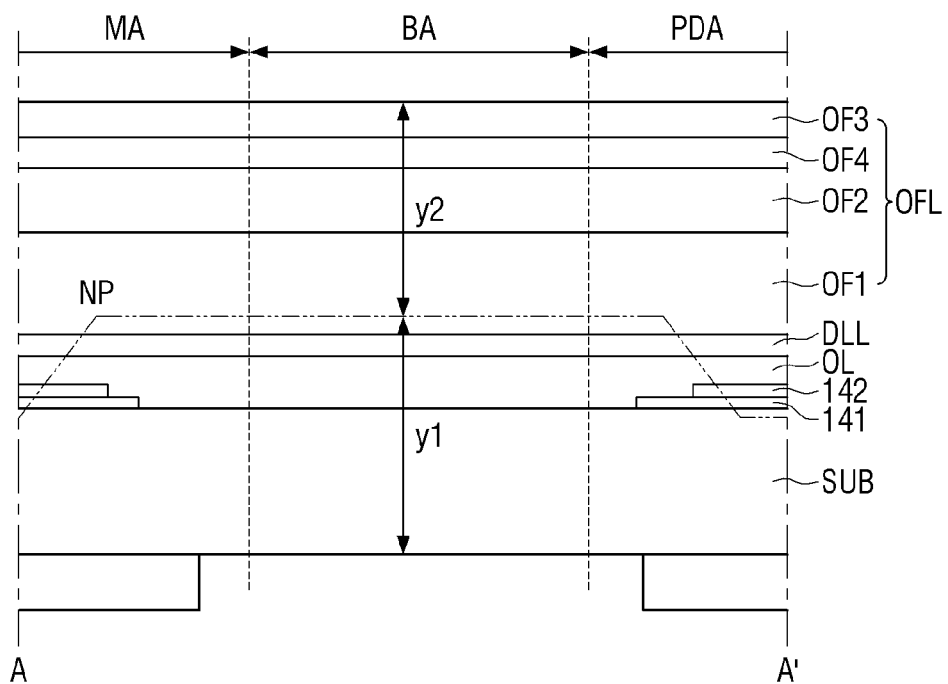
FIG. 7 is a schematic cross-sectional view illustrating another example of display panel cut along A-A' in FIG. 2.

FIG. 6 is a cross-sectional view schematically illustrating an example of a display panel cut along A-A' in FIG. 2, and FIG. 7 is a schematic cross-sectional view illustrating another example of display panel cut along A-A' in FIG. 2.

Referring to FIGS. 5 and 6, the display panel 100 may be folded so that the bent area BA is bent so as to have a constant curvature. The bent area BA may include a substrate SUB, an organic insulating layer OL, a line layer DLL, and a stack OFL of organic layers.

The substrate SUB, the organic insulating layer OL, the line layer DLL, and the stack OFL of the organic layers of the bent area BA may extend from the main area MA to the pad area PDA.

The substrate SUB of the bent area BA may extend from the substrate SUB of the main area MA, and the substrate SUB of the bent area BA and the substrate SUB of the main area MA may be made of a same material.

The organic insulating layer OL may extend from the first planarization layer 160 or the second planarization layer 180 of the main area MA.

In case that the organic insulating layer OL extends from the first planarization layer 160, the organic insulating layer OL and the first planarization layer 160 may be made of a same material. In case that the organic insulating layer OL extends from the first planarization layer 180, the organic insulating layer OL and the second planarization layer 180 may be made of a same material.

The line layer DLL may include lines electrically connected to the signal lines of the display area DA (see FIG. 1) of the main area MA and extending to a pad disposed in the pad area PDA.

The stack OFL of the organic layers may include a first organic layer OF1, a second organic layer OF2, and a third organic layer OF3.

The layers of the stack OFL of the organic layers may extend or respectively extend from the organic layers (or organic film layer or organic layer layers) of the main area MA to organic layers of the pad area PDA and may cover the line layer DLL.

Each of the layers of the stack OFL of the organic layers extends from each of the organic layers of the main area MA. The organic layers of the main area MA may include at least two of the second planarization layer 180 of the transistor layer TFTL, the bank 190 or a pixel defining film of the light-emitting element layer EML, the encapsulation organic layer TFE2 of the thin-film encapsulation layer TFEL, and the color filter layer CFL.

The first organic layer OF1 and the second organic layer OF2 of the stack OFL may extend respectively from at least two of the organic layers of the main area MA, for example, the second planarization layer 180 of the transistor layer TFTL, the bank 190 or a spacer of the light-emitting element layer EML, the encapsulation organic layer TFE2 of the thin-film encapsulation layer TFEL, and the color filter layer CFL. The first organic layer OF1, the second organic layer OF2, and the organic layers of the main area MA from which the first organic layer OF1 and the second organic layer OF2 extend respectively will be described below.

Further, the third organic layer OF3 of the stack OFL may extend from the overcoat layer OC of the main area MA. The third organic layer OF3 and the overcoat layer OC may be made of a same material.

A thickness of the stack OFL of the organic layers may be in a range of about 9 µm to about 15 µm, and more specifically, about 10 µm to about 12 µm.

Referring to FIG. 7, the display panel 100 may be folded so that the bent area BA is bent so as to have a constant curvature. The bent area BA may include a substrate SUB, an organic insulating layer OL, a line layer DLL, and a stack OFL of organic layers.

The stack OFL of the organic layers may include a first organic layer OF1, a second organic layer OF2, a third organic layer OF3 and a fourth organic layer OF4.

The first organic layer OF1, the second organic layer OF2, the third organic layer OF3 and the fourth organic layer OF4 of the stack OFL may extend respectively from the organic layers of the main area MA. The organic layers of the main area MA may include at least two of the second planarization layer 180 of the transistor layer TFTL, the bank 190 of the light-emitting element layer EML, the encapsulation organic layer TFE2 of the thin-film encapsulation layer TFEL, and the color filter layer CFL.

The first organic layer OF1, the second organic layer OF2 and the fourth organic layer OF4 of the stack OFL may extend respectively from at least two of the organic layers of the main area MA, for example, the second planarization layer 180 of the transistor layer TFTL, the bank 190 or the spacer of the light-emitting element layer EML, the encapsulation organic layer TFE2 of the thin-film encapsulation layer TFEL, and the color filter layer CFL. The first organic layer OF1, the second organic layer OF2, the fourth organic layer OF4, and the organic layers of the main area MA from which the first organic layer OF1, the second organic layer OF2 and the fourth organic layer OF4 of the stack OFL extend respectively will be described below.

Further, the third organic layer OF3 of the stack OFL extends from the overcoat layer OC of the main area MA. The third organic layer OF3 and the overcoat layer OC may be made of a same material.

As described with reference to FIGS. 6 and 7, the organic layers of the bent area BA may extend respectively from the organic layers of the main area MA. The organic layer of the bent area BA and the organic layer of the main area MA from which the organic layer of the bent area BA extends may be made of a same material. An inorganic layer is not disposed on the line layer DLL in the bent area BA.

FIGS. 6 and 7 illustrate examples in which the numbers of the organic layers of the stack OFL of organic layers are three and four, respectively. However, the disclosure is not limited thereto. The number of the organic layers of the stack OFL of the organic layers may be at least five. However, even in this case, a thickness of the stack OFL of the organic layers in the bent area BA may be in a range of about 9 µm to about 15 µm, and more specifically, about 10 µm to about 12 µm.

In an embodiment, as may be identified with reference to FIGS. 6 and 7, the bent area BA does not include an inorganic layer (or inorganic material layer) made of an inorganic material. The inorganic layer is generally more rigid than a metal of the line layer DLL is. In case that the same amount of bending stress is applied, a probability that a crack occurs in the inorganic layer may be higher than a probability that a crack occurs in the metal of the line layer DLL. The crack occurring in the inorganic layer may grow and propagate toward the line layer DLL. Therefore, in an embodiment, the possibility of the crack formation may be reduced by excluding the inorganic layer from the bent area BA.

In case that the display panel 100 is bent at the bent area BA, a stress is applied to the display panel 100. The stress may be defined as a force externally applied to a display device 10 per a unit area of the display device 10. A portion of the display panel 100 to which the stress is applied is deformed.

Stresses of different magnitudes and different directions are respectively applied to different portions of the display panel 100. For example, in case that the display device 10 is bent, compressive stress is applied to an inner portion y1 closer to a bending axis, while tensile stress is applied to an outer portion y2 far away from the bending axis.

The display panel 100 has a neutral plane NP. Along the neutral plane NP of the display panel 100, magnitudes of the compressive stress and the tensile stress are equal to each other. The compressive stress and the tensile stress acting on the neutral plane NP are equal to each other in magnitude and act in opposite directions to each other. Accordingly, along the neutral plane NP of the display device 10, each of a strain due to the tensile stress and a strain due to the compressive stress is substantially zero.

A position of the neutral plane NP may be obtained based on three variables, for example, a thickness of an object, a Young's modulus thereof, and a Poisson's ratio thereof. Therefore, in case that the Young's modulus and the Poisson's ratio are fixed, the position of the neutral plane NP may be adjusted by controlling the thickness of the object. A method for calculating the position of the neutral plane NP may use a known method, and thus a detailed description thereof is omitted.

As described, the position of the neutral plane NP inside the display panel 100 may be adjusted by controlling the thickness of the stack OFL of the organic layers in the bent area BA.

In an embodiment, in case that the neutral plane NP is positioned on the line layer DLL in the bent area BA, a bending stress on the line layer DLL may be reduced. It is ideal for the neutral plane NP to be located on the line layer DLL. However, when considering an implementation error, the neutral plane NP may be located in the first organic layer OF1 as an organic layer adjacent to the line layer DLL.

In an embodiment, the neutral plane NP may be positioned on the line layer DLL or in the first organic layer OF1 adjacent to the line layer DLL.

Each of the organic layers of the stack OFL of the organic layers may include patterns. The patterns may be formed using a photolithography process in which light is irradiated into a mask having a circuit pattern and disposed on a wafer to form a pattern. A shape of the pattern is not limited to a specific shape. The patterns of a same shape may be repeatedly arranged. The shapes of the patterns of the different layers of the stack OFL of the of organic layers may be the same as or may be different from each other.

The patterns formed in a same layer may be spaced apart from each other by a predefined spacing. A first space area may be defined between adjacent ones of the organic patterns formed in the same film. The first space area means a spacing between adjacent ones of the organic patterns. A dimension of the first space area may be constant or not constant across the organic patterns, depending on the shapes of the organic patterns.

The shape of the pattern will be described below with reference to FIGS. 10 to 23C.

Figure 8:
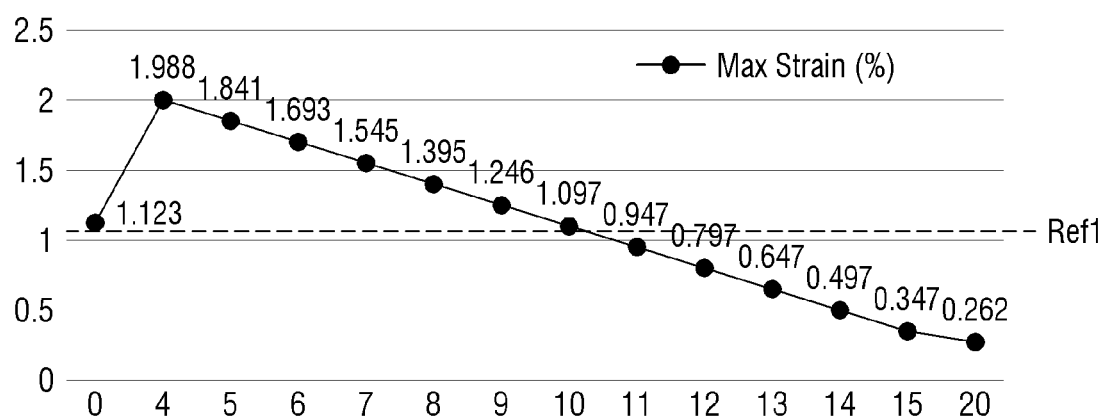
FIG. 8 is a graph illustrating a simulation result of strain occurring in a display device according to an embodiment.
Figure 9:
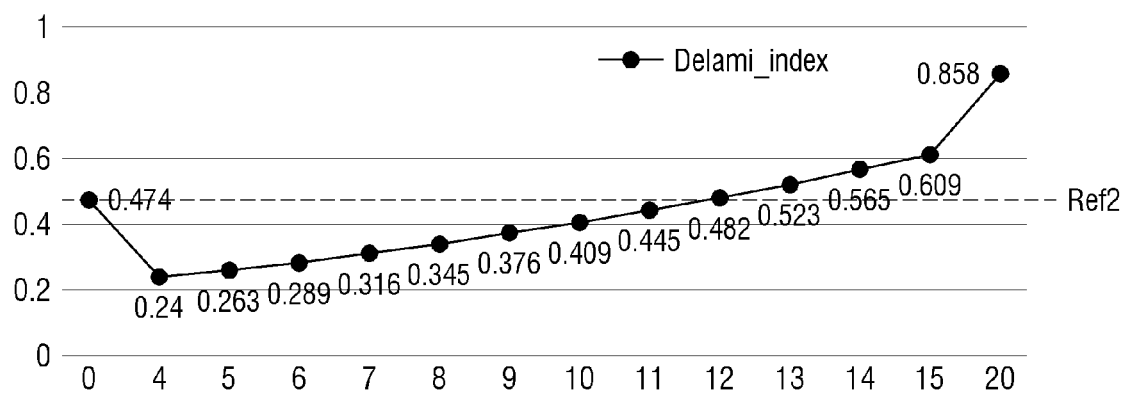
FIG. 9 is a graph illustrating a simulation result of delamination occurring in a display device according to an embodiment.

FIG. 8 is a schematic graph illustrating a simulation result of a strain occurring in the display device according to an embodiment, and FIG. 9 is a schematic graph illustrating a simulation result of delamination occurring in the display device according to an embodiment.

The simulations in FIGS. 8 and 9 were performed while changing the thickness of the stack of the organic layers while a Young's modulus was set to about 8230 MPA and a Poisson's ratio was set to about 0.32. A simulation result of the strain in a case in which a bending protective layer is formed in a bent area of a display device as in the prior art is set as a reference Ref1. For example, the reference Ref of the strain may be about 1.

As shown in FIG. 8, the strain is maximum in case that the thickness of the stack of the organic layers becomes about 4 μm. As the thickness increases, the strain decreases. In case that the thickness of the stack of the organic layers becomes about 10 μm or larger, the strain becomes smaller than the reference Ref1.

As shown in FIG. 9, a delamination index is minimum in case that the thickness of the stack of the organic layers is about 4 μm. As the thickness increases, the index increases. In case that the thickness of the stack of the organic layers is about 12 μm, the index become larger than a reference value Ref2.

Therefore, it may be identified according to this simulation result that the thickness of the stack of the organic layers may be in a range between about 10 μm to about 12 μm in terms of both the strain and the delamination at a Young's modulus of about 8 GPA.

Figure 10:
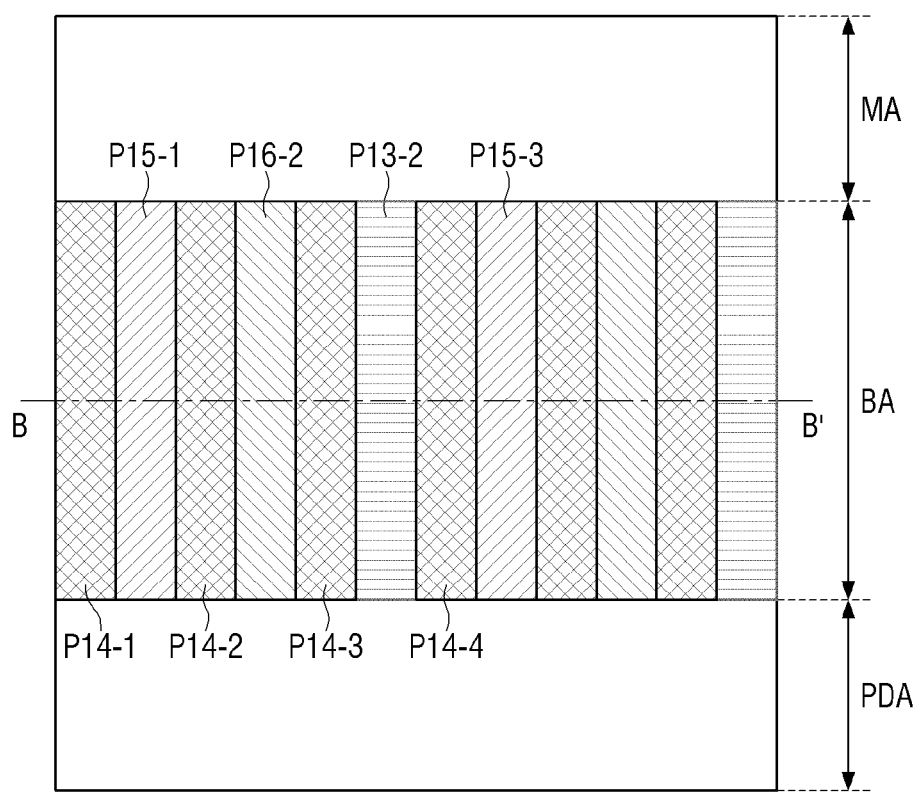
FIG. 10 is a schematic plan view including a bent area according to an embodiment.
Figure 11:
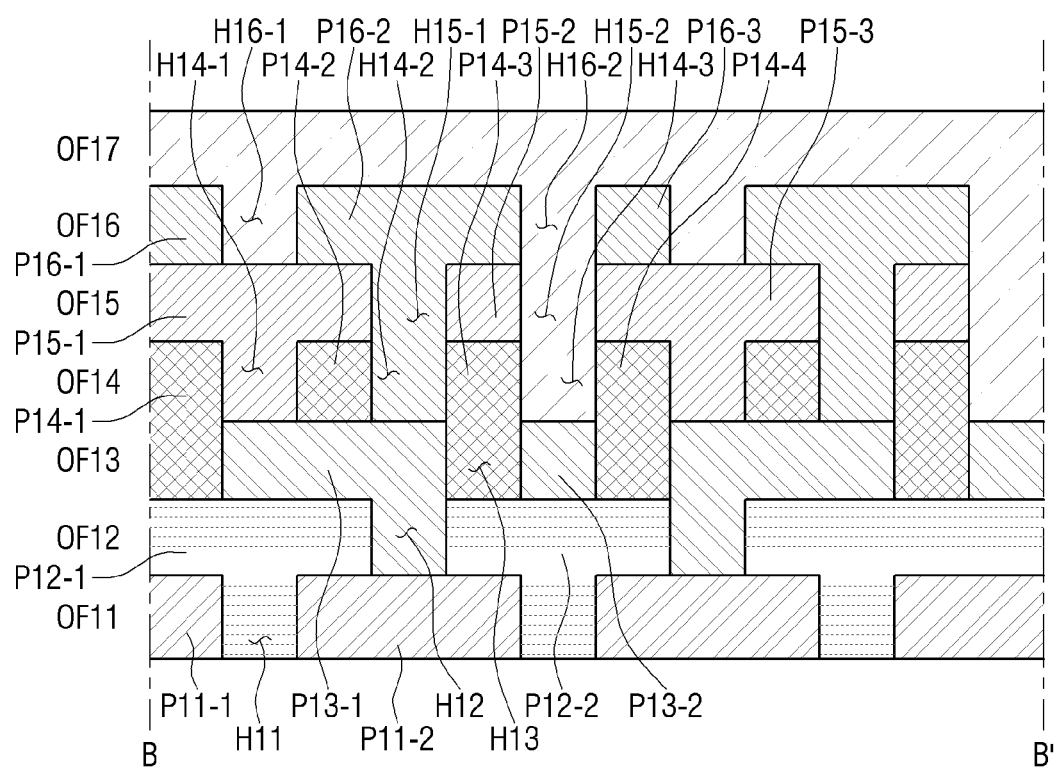
FIG. 11 is a schematic cross-sectional view taken along B-B' in FIG. 10, wherein in FIG. 10, a cross-sectional view of a main area MA may be similar to that in FIG. 5.

FIG. 10 is a schematic plan view including a bent area according to an embodiment, and FIG. 11 is a schematic cross-sectional view taken along B-B' in FIG. 10. In FIG. 10, the cross-sectional view of the main area MA in FIG. 10 may be similar to that in FIG. 5.

Referring to FIGS. 5, 10, and 11, the stack OFL of the organic layers may include a first organic layer OF11, a second organic layer OF12, a third organic layer OF13, a fourth organic layer OF14, a fifth organic layer OF15, a sixth organic layer OF16 and a seventh organic layer OF17. Each of the organic layers of the stack OFL of the organic layers may have patterns. The shape of the pattern may be a line shape in a plan view. Specifically, the line shape may be an elongated slit with a vertical dimension (e.g., a predetermined or selectable dimension) and a thickness (e.g., a predetermined or selectable thickness). In the plan view, depending on transparency of each of the patterns, an underlying pattern may be visible. For example, even in case that a light-blocking pattern is disposed in the fourth organic layer OF14, the light-blocking pattern may be visible in the plan view.

The first organic layer OF11 may extend from the first planarization layer 160 of the transistor layer TFTL, and may have a thickness of about 1 μm to about 2 μm. The second organic layer OF12 may extend from the second planarization layer 180 of the transistor layer TFTL, and may have a thickness of about 1 μm to about 2 μm. The third organic layer OF13 may extend from the bank 190 of the light-emitting element layer EML, and may have a thickness of about 1 μm to about 2 μm. The fourth organic layer OF14 may extend from the light-blocking member BM of the color filter layer CFL, and may have a thickness of about 1 μm to about 2 μm.

The fifth organic layer OF15 and the sixth organic layer OF16 may respectively extend from any two color filters among the color filters CF1, CF2, and CF3. For example, the fifth organic layer OF15 may extend from the first color filter CF1, and the sixth organic layer OF16 may extend from the third color filter CF3. Each of the fifth organic layer OF15 and the sixth organic layer OF16 may have a thickness of about 2.0 μm to about 3.0 μm. The seventh organic layer OF17 may extend from the overcoat layer OC, and may have a thickness of about 1.5 μm to about 2.5 μm. The thickness of the stack OFL of the of organic layers, for example, a total thickness of the first organic layer OF11, the second organic layer OF12, the third organic layer OF13, the fourth organic layer OF14, the fifth organic layer OF15, the sixth organic layer OF16 and the seventh organic layer OF17 may be in a range of about 10 μm to about 12 μm.

Each of the first organic layer OF11, the second organic layer OF12, the third organic layer OF13, the fourth organic layer OF14, the fifth organic layer OF15, and the sixth organic layer OF16 may have a line shaped pattern. Sizes and spacings of the patterns of different organic layers may be different from each other.

A through-hole extending through the organic layer may be defined due to the formation of the pattern in the organic layer. Organic layers of different layers may contact each other via the through-hole.

In an example, a through-hole H11 extending through the first organic layer OF11 may be formed in a space defined between a first pattern P11-1 and a second pattern P11-2 of the first organic layer OF11. The second organic layer OF12 formed on the first organic layer OF11 may be formed so as to fill the through-hole H11. As a result, a contact area between the first organic layer OF11 and the second organic layer OF12 may be increased.

A through-hole H12 extending through the second organic layer OF12 may be formed in a space defined between a first pattern P12-1 and a second pattern P12-2 of the second organic layer OF12. The third organic layer OF13 formed on the second organic layer OF12 may be formed so as to fill the through-hole H12. As a result, a contact area between the second organic layer OF12 and the third organic layer OF13 may be increased. Although it is illustrated that the through-hole H11 of the first organic layer OF11 and the through-hole H12 of the second organic layer OF12 do not overlap each other, the disclosure is not limited thereto.

A through-hole H13 extending through the third organic layer OF13 may be formed in a space defined between a first pattern P13-1 and a second pattern P13-2 of the third organic layer OF13. The fourth organic layer OF14 formed on the third organic layer OF13 may be formed so as to fill the through-hole H13. As a result, a contact area between the third organic layer OF13 and the fourth organic layer OF14 may be increased. It is illustrated that the through-hole H12 of the second organic layer OF12 and the through-hole H13 of the third organic layer OF13 do not overlap each other. However, the disclosure is not limited thereto.

Through-holes H14-1, H14-2, and H14-3 extending through the fourth organic layer OF14 may be formed in a space defined between a first pattern P14-1 and a second pattern P14-2 of the fourth organic layer OF14. The fifth organic layer OF15 formed on the fourth organic layer OF14 may be formed so as to fill the through-hole H14-1. This may increase a contact area between the fourth organic layer OF14 and the fifth organic layer OF15. The through-hole H14-3 may be disposed between a third pattern P14-3 and a fourth pattern P14-4 of the fourth organic layer OF14. Although it is illustrated that the through-hole H13 of the third organic layer OF13 and the through-hole H14 of the fourth organic layer OF14 do not overlap each other, the disclosure is not limited thereto.

A through-hole H15-1 extending through the fifth organic layer OF15 may be formed in a space defined between a first pattern P15-1 and a second pattern P15-2 of the fifth organic layer OF15. A through-hole H15-2 extending through the fifth organic layer OF15 may be formed in a space defined between the second pattern P15-2 and a third pattern P15-3 thereof. The through-hole H15-1 of the fifth organic layer OF15 may be positioned to overlap the through-hole H14-2 extending through the fourth organic layer OF14. The sixth organic layer OF16 formed on the fifth organic layer OF15 may be formed so as to fill the through-hole H15-2 of the fifth organic layer OF15 and through-hole H14-2 extending through the fourth organic layer OF14 overlapping each other. Accordingly, a contact area between the fifth organic layer OF15 and the sixth organic layer OF16 may be increased. Further, the third organic layer OF13 and the sixth organic layer OF16 that are not adjacent to each other may contact each other via the through-hole H15-1 of the fifth organic layer OF15 and the through-hole H14-2 extending through the fourth organic layer OF14 overlapping each other.

A through-hole H16-1 extending through the sixth organic layer OF16 may be formed in a space defined between a first pattern P16-1 and a second pattern P16-2 of the sixth organic layer OF16. A through-hole H16-2 extending through the sixth organic layer OF16 may be formed in a space defined between the second pattern P16-2 and a third pattern P16-3 thereof. The seventh organic layer OF17 formed on the sixth organic layer OF16 may be formed so as to fill the through-hole H16-1. Accordingly, a contact area between the sixth organic layer OF16 and the seventh organic layer OF17 may be increased.

The through-hole H16-2 of the sixth organic layer OF16 may be positioned to overlap the through-hole H15-2 extending through the fifth organic layer OF15. In case that, as described above, the through-hole H15-2 extending through the fifth organic layer OF15 overlaps the through-hole H14-2 extending through the fourth organic layer OF14, the through-hole H16-2 of the sixth organic layer OF16 may overlap the through-hole H14-2 extending through the fourth organic layer OF14. The seventh organic layer OF17 formed on the sixth organic layer OF16 may be formed so as to fill the through-hole H16-2 of the sixth organic layer OF16, the through-hole H15-2 of the fifth organic layer OF15, and the through-hole H14-2 extending through the fourth organic layer OF14 overlapping each other. Accordingly, a contact area between the sixth organic layer OF16 and the seventh organic layer OF17 may be increased. Further, the third organic layer OF13 and the seventh organic layer OF17 which are not adjacent to each other may contact each other via the through-hole H16-2 of the sixth organic layer OF16, the through-hole H15-2 of the fifth organic layer OF15, and the through-hole H14-2 extending through the fourth organic layer OF14 overlapping each other.

Figure 12:
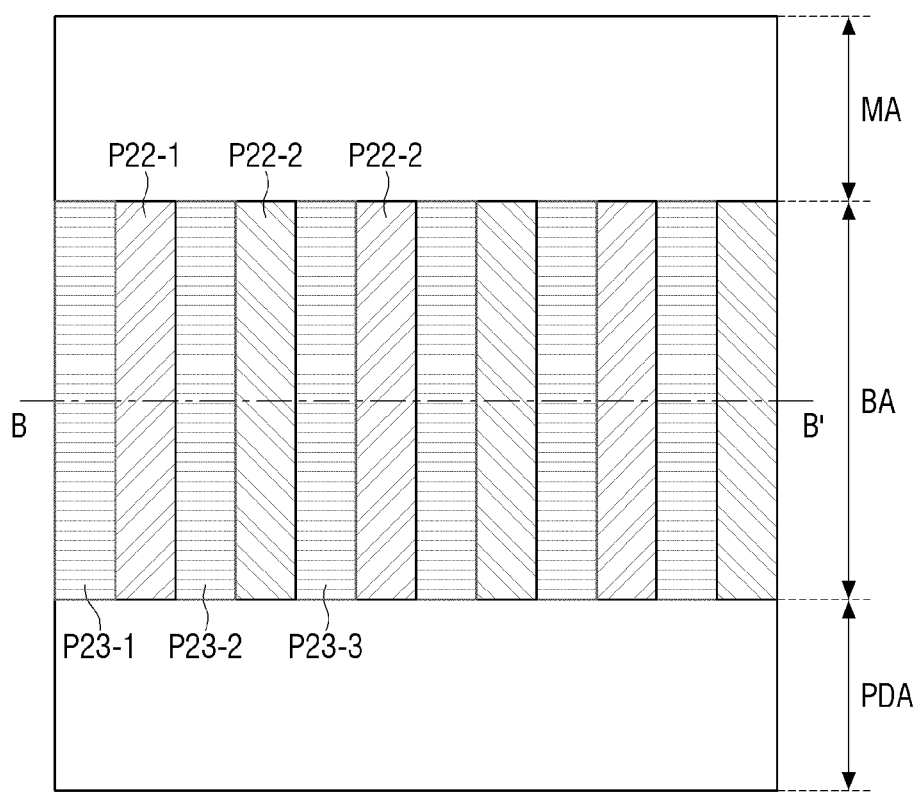
FIG. 12 is a schematic plan view including a bent area according to an embodiment.
Figure 13:
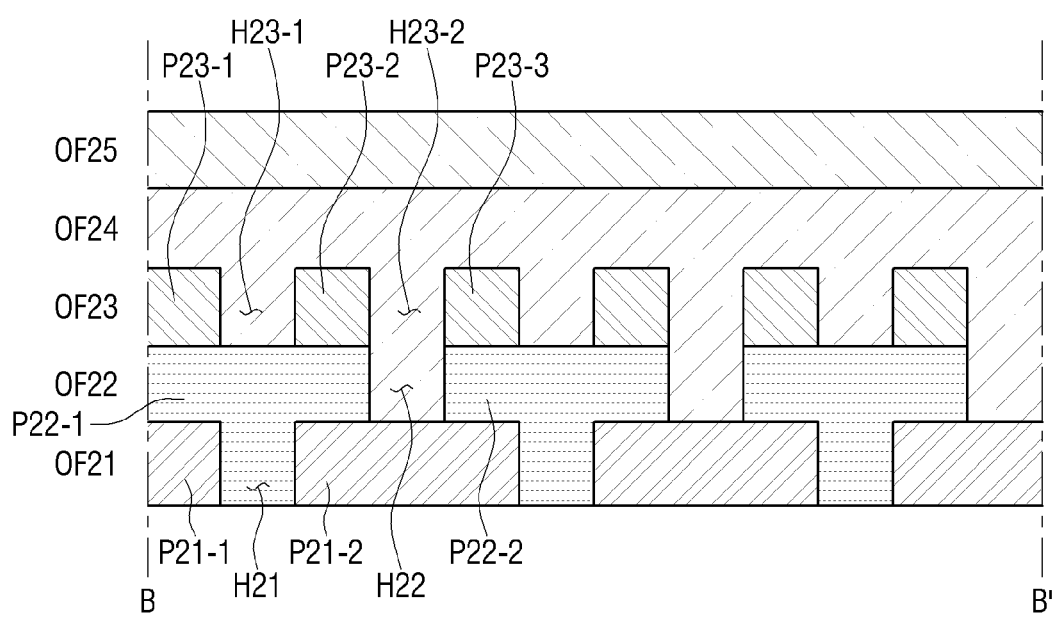
FIG. 13 is a schematic cross-sectional view taken along B-B' in FIG. 12, wherein in FIG. 12, a cross-sectional view of a main area MA may be similar to that in FIG. 5.

FIG. 12 is a schematic plan view including a bent area according to an embodiment, and FIG. 13 is a schematic cross-sectional view taken along B-B' in FIG. 12. In FIG. 12, a cross-sectional view of the main area MA may be similar to that in FIG. 5.

Referring to FIGS. 5, 12, and 13, the stack OFL of the organic layers may include a first organic layer OF21, a second organic layer OF22, a third organic layer OF23, a fourth organic layer OF24, and a fifth organic layer OF25. Each of the organic layers of the stack OFL of the organic layers may have patterns. A shape of the pattern may be a line shape in a plan view. Specifically, the line shape may be an elongated slit with a vertical dimension (e.g., a predetermined or selectable dimension) and a thickness (e.g., a predetermined or selectable thickness).

The first organic layer OF21 may extend from the first planarization layer 160 of the transistor layer TFTL, and may have a thickness of about 1 µm to about 2 µm. The second organic layer OF22 may extend from the second planarization layer 180 of the transistor layer TFTL, and may have a thickness of about 1 µm to about 2 µm. The third organic layer OF23 may extend from bank 190 of the light-emitting element layer EML, and may have a thickness of about 1 µm to about 2 µm. The fourth organic layer OF24 may extend from the encapsulation organic layer TFE2 of the thin-film encapsulation layer TFEL, and may have a thickness of about 5.5 µm to about 6.5 µm. The fifth organic layer OF25 may extend from the overcoat layer OC, and may have a thickness of about 1.5 µm to about 2.5 µm. A thickness of the stack OFL of the organic layers, for example, a total thickness of the first organic layer OF21, the second organic layer OF22, the third organic layer OF23, the fourth organic layer OF24, and the fifth organic layer OF25 may be in a range of about 10 µm to about 12 µm.

Each of the first organic layer OF21, the second organic layer OF22 and the third organic layer OF23 may include a line shaped pattern. Sizes and spacings of the patterns of different organic layers may be different from each other.

A through-hole extending through the organic layer may be formed due to the formation of the pattern in the organic layer. Organic layers of different layers may contact each other via the through-hole.

In an example, a through-hole H21 extending through the first organic layer OF21 may be formed in a space defined between a first pattern P21-1 and a second pattern P21-2 of the first organic layer OF21. The second organic layer OF22 formed on the first organic layer OF21 may be formed so as to fill the through-hole H21. As a result, a contact area between the first organic layer OF21 and the second organic layer OF22 may be increased.

A through-hole H22 extending through the second organic layer OF22 may be formed in a space defined between a first pattern P22-1 and a second pattern P22-2 of the second organic layer OF22. The third organic layer OF23 formed on the second organic layer OF22 may be formed so as to fill the through-hole H22. As a result, a contact area between the second organic layer OF22 and the third organic layer OF23 may be increased. Although it is illustrated that the through-hole H21 of the first organic layer OF21 and the through-hole H22 of the second organic layer OF22 do not overlap each other, the disclosure is not limited thereto.

A through-hole H23-1 extending through the third organic layer OF23 may be formed in a space defined between a first pattern P23-1 and a second pattern P23-2 of the third organic layer OF23. The fourth organic layer OF24 formed on the third organic layer OF23 may be formed so as to fill the through-hole H23-1. This may increase a contact area between the third organic layer OF23 and the fourth organic layer OF24. A through-hole H23-2 extending through the third organic layer OF23 may be formed in a space defined between the second pattern P23-2 and a third pattern P23-3 of the third organic layer OF23. The through-hole H23-2 extending through the third organic layer OF23 may be positioned to overlap the through-hole H22 extending through the second organic layer OF22. The fourth organic layer OF24 located on the third organic layer OF23 may be formed so as to fill a through-hole H23-2 extending through the third organic layer OF23 and the through-hole H22 extending through the second organic layer OF22. Further, the first organic layer OF21 and the fourth organic layer OF24 which are not adjacent to each other may contact each other via the through-hole H23-2 extending through the third organic layer OF23 and the through-hole H22 extending through the second organic layer OF22 overlapping each other.

A spacing between the first pattern P22-1 and the second pattern P22-2 of the second organic layer OF22 may be different from a spacing between the first pattern P23-1 and the second pattern P23-2 of the third organic layer OF23.

Each of the fourth organic layer OF24 and the fifth organic layer OF25 may not include a pattern.

Figure 14:
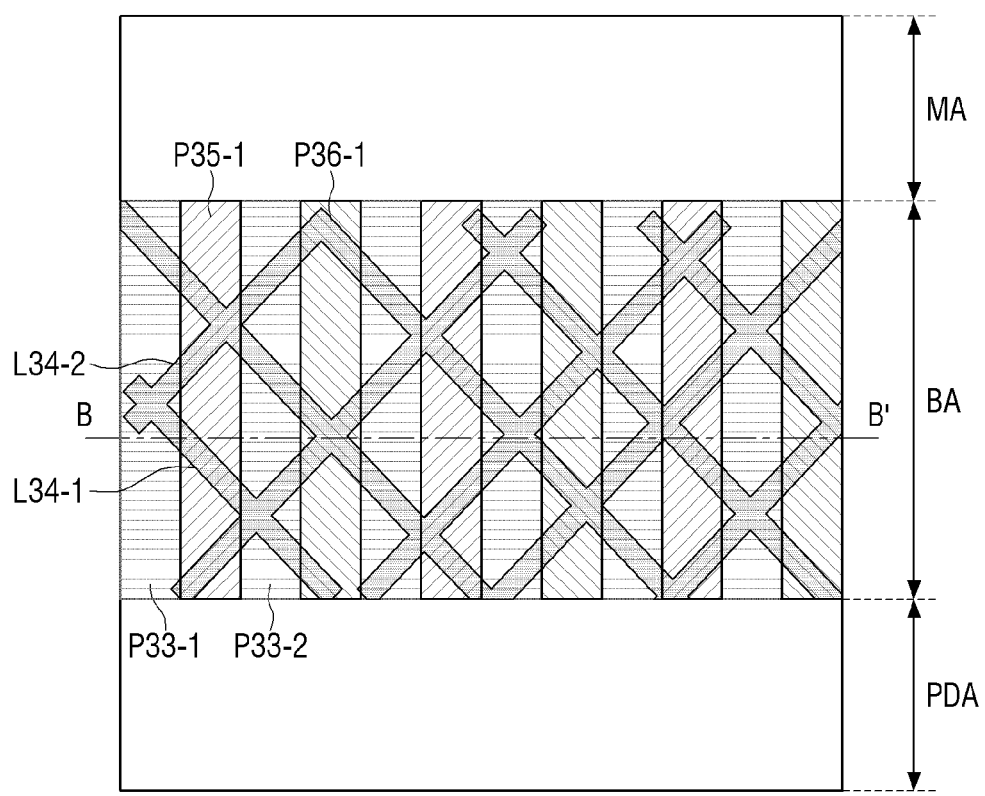
FIG. 14 is a schematic plan view including a bent area according to an embodiment.
Figure 15:
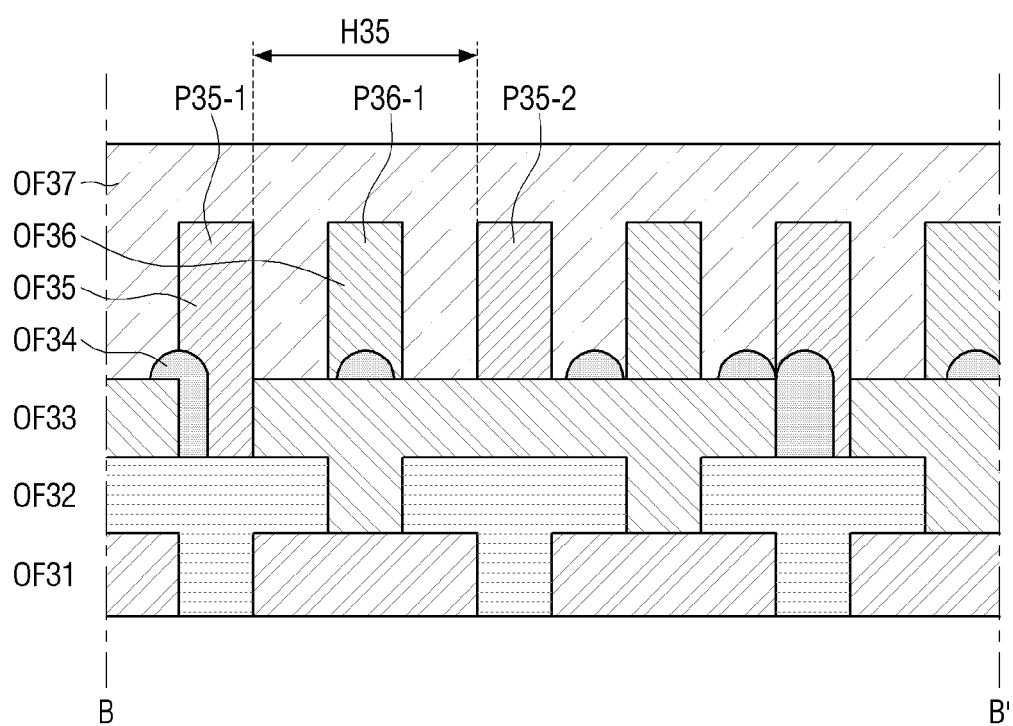
FIG. 15 is a schematic cross-sectional view taken along B-B' in FIG. 14.

FIG. 14 is a schematic plan view including a bent area according to an embodiment, and FIG. 15 is a schematic cross-sectional view taken along B-B' in FIG. 14. In FIG. 14, a cross-sectional view of the main area MA may be similar to that in FIG. 5.

Referring to FIGS. 5, 14, and 15, the stack OFL of the organic layers may include a first organic layer OF31, a second organic layer OF32, a third organic layer OF33, a fourth organic layer OF34, a fifth organic layer OF35, a sixth organic layer OF36 and a seventh organic layer OF37. Some of the first to seventh organic layers OF31 to OF37 of the stack OFL of the organic layers may have patterns. A shape of the pattern may be a line shape or the patterns may extend in a diagonal manner in a plan view. Specifically, the line shape may be an elongated slit with a vertical dimension (e.g., a predetermined or selectable dimension) and a thickness (e.g., a predetermined or selectable thickness). The diagonal manner may mean a manner in which lines L34-1 having a first inclination and lines L34-2 having a second inclination intersect each other.

The first organic layer OF31 may extend from the first planarization layer 160 of the transistor layer TFTL, and may have a thickness of about 1 µm to about 2 µm. The second organic layer OF32 may extend from the second planarization layer 180 of the transistor layer TFTL, and may have a thickness of about 1 µm to about 2 µm. The third organic layer OF33 may extend from the bank 190 of the light-emitting element layer EML, and may have a thickness of about 1 µm to about 2 µm. The fourth organic layer OF34 may extend from the light-blocking member BM of the color filter layer CFL, and may have a thickness of about 1 µm to about 2 µm.

The fifth organic layer OF35 and the sixth organic layer OF36 may respectively extend from two color filters of the color filters CF1, CF2, and CF3. For example, the fifth organic layer OF35 may extend from the first color filter CF1, and the sixth organic layer OF36 may extend from the third color filter CF3. Each of the fifth organic layer OF35 and the sixth organic layer OF36 may have a thickness of about 2.0 µm to about 3.0 µm. The seventh organic layer OF37 may extend from the overcoat layer OC, and may have a thickness of about 1.5 µm to about 2.5 µm. A thickness of the stack OFL, for example, a total thickness of the first organic layer OF31, the second organic layer OF32, the third organic layer OF33, the fourth organic layer OF34, the fifth organic layer OF35, the sixth organic layer OF36 and the seventh organic layer OF37 may be in a range of about 10 µm to about 12 µm.

Each of the first organic layer OF31, the second organic layer OF32, the third organic layer OF33, the fifth organic layer OF35 and the sixth organic layer OF36 may include a line shaped pattern. Sizes and spacings of the patterns of different organic layers may be different from each other. The fourth organic layer OF34 may include patterns extending in a diagonal shape.

A through-hole extending through the organic layer may be formed due to the formation of the pattern in the organic layer. Organic layers of different layers may contact each other via the through-hole.

A through-hole formed between patterns of an organic layer may be filled with a pattern of a further organic layer, such that the different organic layers may be disposed in a same layer.

For example, a first pattern P36-1 of the sixth organic layer OF36 may be disposed in a through-hole H35 formed between a first pattern P35-1 and a second pattern P35-2 of the fifth organic layer OF35. As the pattern of the sixth organic layer OF36 is formed in the through-hole formed between the patterns of the fifth organic layer OP35 as described above, the fifth organic layer OF35 and the sixth organic layer OF36 may be disposed in a same layer.

Figure 16:
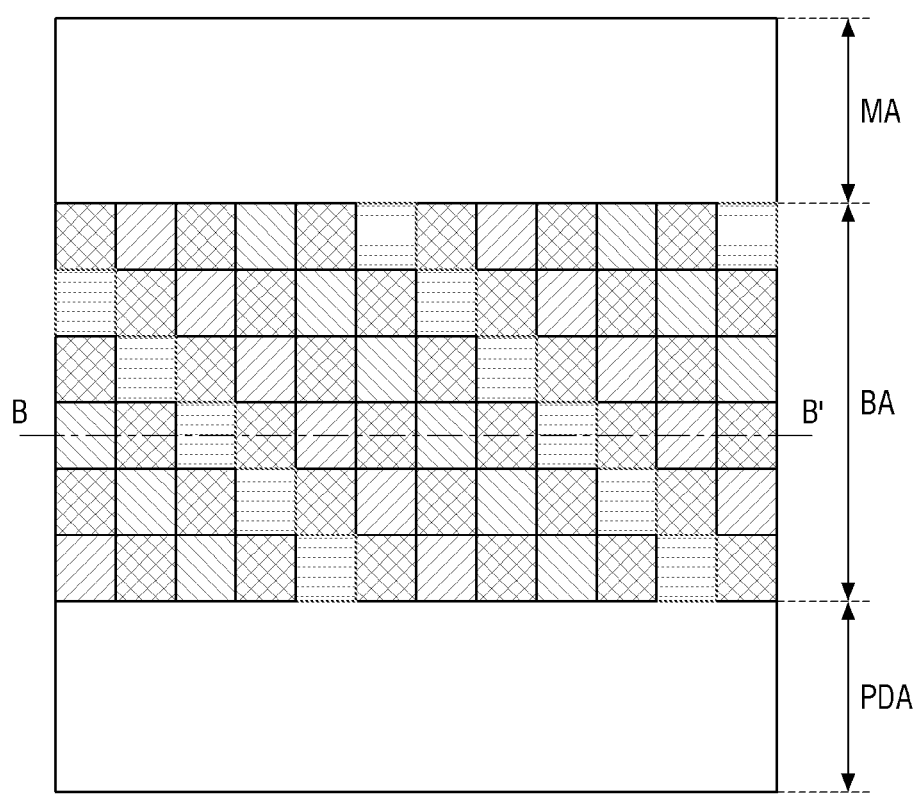
FIG. 16 is a schematic plan view including a bent area according to still another embodiment.
Figure 17:
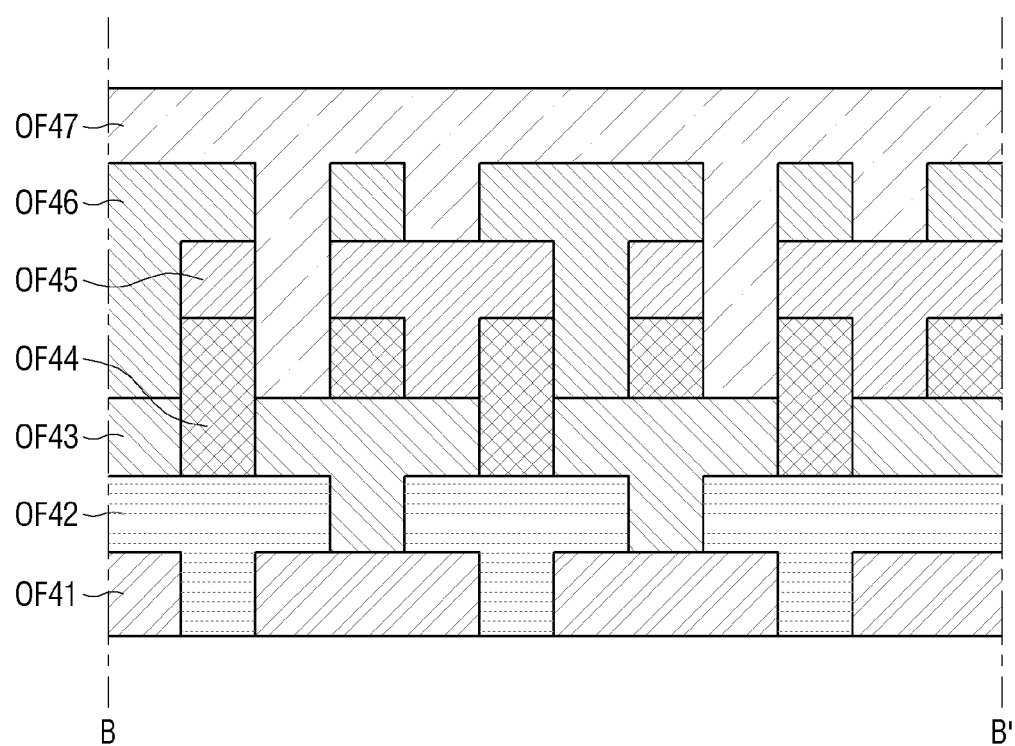
FIG. 17 is a cross-sectional view taken along B-B' in FIG. 16.

FIG. 16 is a schematic plan view including a bent area according to an embodiment, and FIG. 17 is a schematic cross-sectional view taken along B-B' in FIG. 16. In FIG. 16, a cross-sectional view of the main area MA may be similar to that in FIG. 5.

Referring to FIGS. 5, 16, and 17, the stack OFL of the organic layers may include a first organic layer OF41, a second organic layer OF42, a third organic layer OF43, a fourth organic layer OF44, a fifth organic layer OF45, a sixth organic layer OF46 and a seventh organic layer OF47. Each of the layers of the stack OFL of the organic layers may have patterns. The patterns may be arranged in a checkerboard manner in a plan view. The checkerboard manner may refer to a manner in which island-shaped patterns and through-holes formed therebetween are alternately arranged with each other in a matrix manner. In a plan view, depending on transparency of each of the patterns, an underlying pattern may be visible. For example, even in case that a light-blocking pattern is disposed in the fourth organic layer OF44, the light-blocking pattern may be visible in a plan view.

The first organic layer OF41 may extend from the first planarization layer 160 of the transistor layer TFTL, and may have a thickness of about 1 µm to about 2 µm. The second organic layer OF42 may extend from the second planarization layer 180 of the transistor layer TFTL, and may have a thickness of about 1 µm to about 2 µm. The third organic layer OF43 may extend from the bank 190 of the light-emitting element layer EML, and may have a thickness of about 1 µm to about 2 µm. The fourth organic layer OF44 may extend from the light-blocking member BM of the color filter layer CFL, and may have a thickness of about 1 µm to about 2 µm.

The fifth organic layer OF45 and the sixth organic layer OF46 may respectively extend from two color filters among the color filters CF1, CF2, and CF3. For example, the fifth organic layer OF45 may extend from the first color filter CF1, while the sixth organic layer OF46 may extend from the third color filter CF3. As another example, the fifth organic layer OF45 may extend from the second color filter CF2, while the sixth organic layer OF46 may extend from the third color filter CF3.

Each of the fifth organic layer OF45 and the sixth organic layer OF46 may have a thickness of about 2.0 µm to about 3.0 µm. The seventh organic layer OF47 may extend from the overcoat layer OC, and may have a thickness of about 1.5 µm to about 2.5 µm. A thickness of the stack OFL of the organic layers, for example, a total thickness of the first organic layer OF41, the second organic layer OF42, the third organic layer OF43, the fourth organic layer OF44, the fifth organic layer OF45, the sixth organic layer OF46 and the seventh organic layer OF47 may be in a range of about 10 µm to about 12 µm.

Each of the first organic layer OF41, the second organic layer OF42, the third organic layer OF43, the fourth organic layer OF44, the fifth organic layer OF45, and the sixth organic layer OF46 may include patterns arranged in a checkerboard manner. Sizes and spacings of the patterns of different organic layers may be different from each other.

A through-hole extending through each organic layer may be formed between the patterns of each organic layer. Organic layers of different layers may contact each other via the through-hole.

Figure 18:
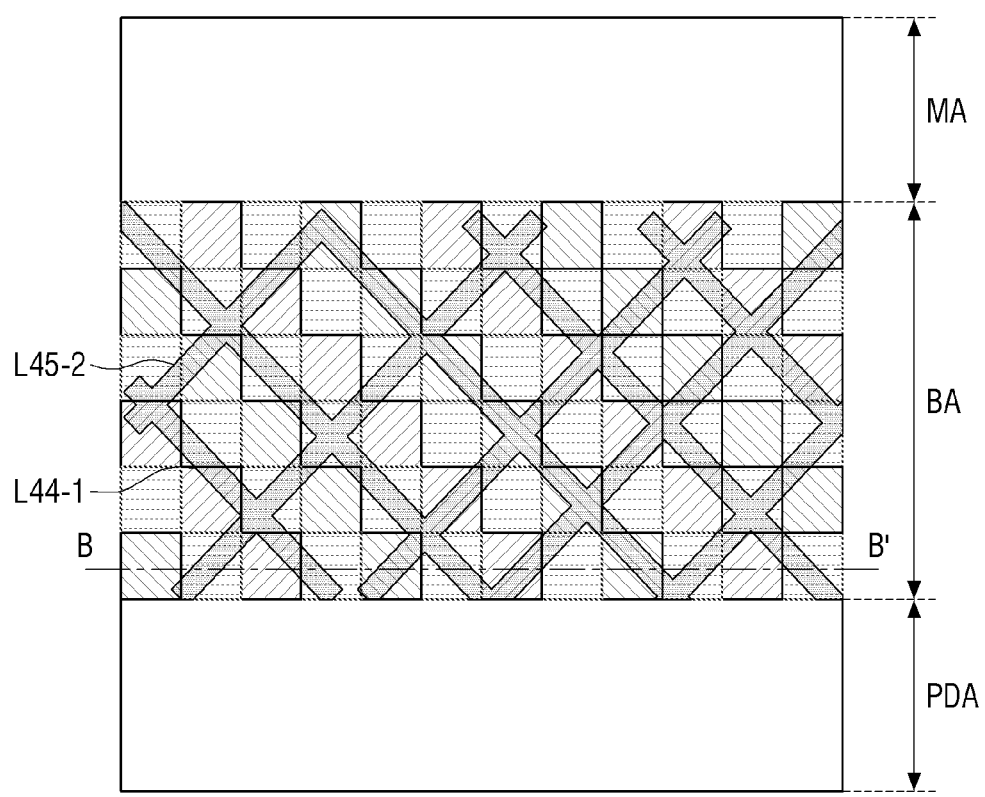
FIG. 18 is schematic a plan view including a bent area according to an embodiment.
Figure 19:
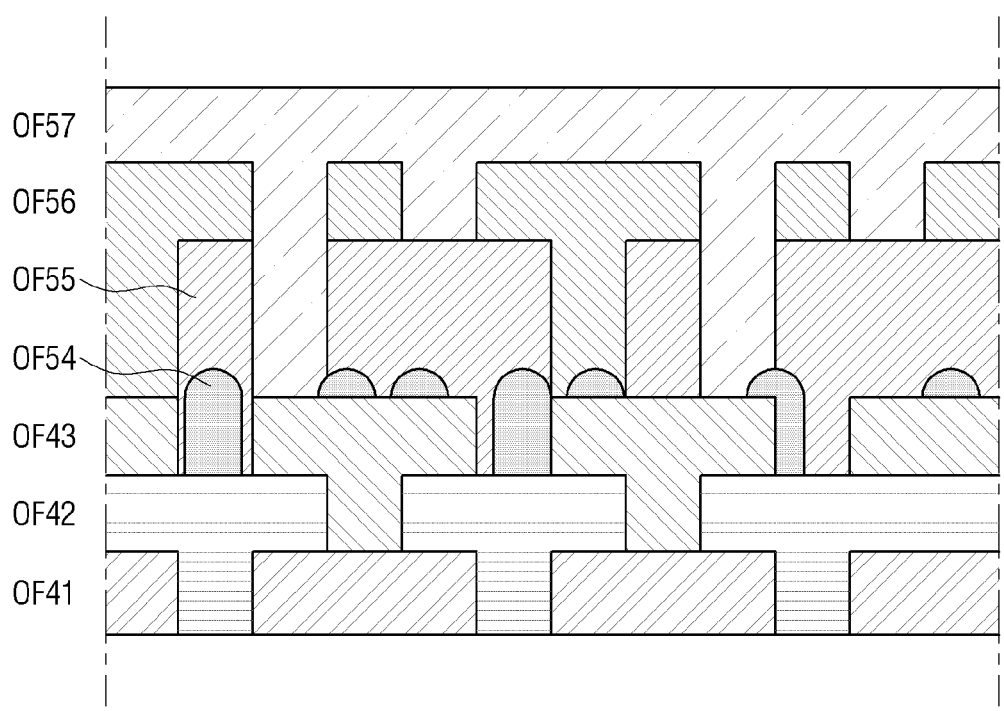
FIG. 19 is a schematic cross-sectional view taken along B-B' in FIG. 18.

FIG. 18 is a schematic plan view including a bent area according to an embodiment, and FIG. 19 is a schematic cross-sectional view taken along B-B' in FIG. 18. In FIG. 18, a cross-sectional view of the main area MA may be similar to that in FIG. 5.

Referring to FIGS. 5, 18, and 19, the stack OFL of the organic layers may include a first organic layer OF41, a second organic layer OF42, a third organic layer OF43, a fourth organic layer OF54, a fifth organic layer OF55, a sixth organic layer OF56 and a seventh organic layer OF57. Each of the layers of the stack OFL of the organic layers may have patterns. The patterns may be arranged in a checkerboard manner such that the patterns intersect each other in a perpendicular manner to each other, or may extend in a diagonal manner in a plan view. In detail, the checkerboard manner may refer to a manner in which island-shaped patterns having a vertical dimension (e.g., a predetermined or selectable dimension) and a thickness (e.g., a predetermined or selectable thickness) and through-holes formed between the patterns are alternately arranged with each other. The diagonal manner may refer to a manner in which lines L44-1 having a first inclination and lines L45-2 having a second inclination intersect each other. In a plan view, depending on transparency of each of the patterns, an underlying pattern may be visible. For example, even in case that a light-blocking pattern is disposed in the fourth organic layer OF54, the light-blocking pattern may be visible in a plan view.

The first organic layer OF41 may extend from the first planarization layer 160 of the transistor layer TFTL, and may have a thickness of about 1 µm to about 2 µm. The second organic layer OF42 may extend from the second planarization layer 180 of the transistor layer TFTL, and may have a thickness of about 1 µm to about 2 µm. The third organic layer OF43 may extend from the bank 190 of the light-emitting element layer EML, and may have a thickness of about 1 µm to about 2 µm. The fourth organic layer OF54 may extend from the light-blocking member BM of the color filter layer CFL, and may have a thickness of about 1 µm to about 2 µm.

Each of the fifth organic layer OF55 and the sixth organic layer OF56 may respectively extend from two color filters of the color filters CF1, CF2, and CF3. For example, the fifth organic layer OF55 may extend from the first color filter CF1, while the sixth organic layer OF56 may extend from the third color filter CF3. As another example, the fifth organic layer OF55 may extend from the second color filter CF2, while the sixth organic layer OF56 may extend from the third color filter CF3.

Each of the fifth organic layer OF55 and the sixth organic layer OF56 may have a thickness of about 2.0 µm to about 3.0 µm. The seventh organic layer OF57 may extend from the overcoat layer OC, and may have a thickness of about 1.5 µm to about 2.5 µm. A thickness of the stack OFL of the organic layers, for example, a total thickness of the first organic layer OF41, the second organic layer OF42, the third organic layer OF43, the fourth organic layer OF54, the fifth organic layer OF55, the sixth organic layer OF56 and the seventh organic layer OF57 may be in a range of about 10 µm to about 12 µm.

Each of the first organic layer OF41, the second organic layer OF42, the third organic layer OF43, the fifth organic layer OF55 and the sixth organic layer OF56 may include patterns arranged in a checkerboard manner. Sizes and spacings of the patterns of different organic layers may be different from each other. A through-hole extending through each organic layer may be formed between the patterns of each organic layer. Organic layers of different layers may contact each other via the through-hole.

Referring to FIGS. 10 to 19, an example in which the organic layers in the bent area BA respectively extend from the organic layers in the main area MA has been illustrated. However, the disclosure is not limited thereto, and modifications including various combinations as shown in Table 1 may be considered.

TABLE 1

| | a | b | c | d | e | f | g | h | i | j |
|---|---|---|---|---|---|---|---|---|---|---|
| Presence or absence | ○ | ○ | ○ | ○ | x | x | ○ | x | x | ○ |
| | ○ | ○ | ○ | ○ | x | x | x | x | ○ | ○ |
| | ○ | ○ | ○ | ○ | x | x | x | ○ | x | ○ |
| | ○ | ○ | ○ | ○ | x | ○ | x | ○ | x | ○ |
| | ○ | ○ | ○ | ○ | x | ○ | x | x | ○ | ○ |
| | ○ | ○ | x | x | x | x | ○ | ○ | x | ○ |
| | ○ | ○ | x | x | x | x | x | ○ | ○ | ○ |
| | ○ | ○ | x | x | x | ○ | ○ | x | ○ | ○ |

TABLE 1-continued

| a | b | c | d | e | f | g | h | i | j |
|---|---|---|---|---|---|---|---|---|---|
| x | x | o | o | x | x | o | o | x | o |
| x | x | o | o | x | x | x | o | o | o |
| x | x | o | o | x | o | o | x | o | o |
| o | o | o | x | x | o | x | o | x | o |
| o | o | o | x | x | o | x | x | o | o |
| o | o | o | x | x | x | o | x | o | o |
| x | o | o | o | x | o | x | o | x | o |
| x | o | o | o | x | o | x | x | o | o |
| x | o | o | o | x | x | o | x | o | o |
| o | x | o | o | x | o | x | o | x | o |
| o | x | o | o | x | o | x | x | o | o |
| o | x | o | o | x | x | o | x | o | o |
| o | x | x | x | x | x | o | o | o | o |
| o | x | x | x | x | o | x | o | o | o |
| x | x | o | x | x | x | o | o | o | o |
| x | x | o | x | x | o | x | o | o | o |
| x | o | x | x | x | x | o | o | o | o |
| x | o | x | x | x | o | x | o | o | o |
| x | x | x | x | o | x | x | x | o | o |
| x | x | x | x | o | x | x | o | x | o |
| x | x | x | x | o | x | o | x | x | o |
| x | x | o | o | o | x | x | x | x | o |
| o | o | x | x | o | x | x | x | x | o |
| o | x | o | x | o | x | x | x | x | o |
| x | o | o | x | o | x | x | x | x | o | a: First planarization layer
b: Second planarization layer
c: Bank
d: Spacer
e: Encapsulation organic layer
f: Light-blocking member
g: First color filter
h: Second color filter
I: Third color filter
J: Overcoat layer Table 1 indicates presence or absence in the bent area BA of an organic layer extending from a corresponding organic layer in the main area MA.

A first row of table 1 corresponds to an example in which a stack of 6 organic layers respectively extending from the first planarization layer, the second planarization layer, the bank, the spacer, the first color filter, and the overcoat layer in the main area MA (see FIG. 5) is present in the bent area BA.

A second row of table 1 corresponds to an example in which a stack of 6 organic layers respectively extending from the first planarization layer, the second planarization layer, the bank, the spacer, the third color filter, and the overcoat layer in the main area MA is present in the bent area BA.

A third row of table 1 corresponds to an example in which a stack of 6 organic layers respectively extending from the first planarization layer, the second planarization layer, the bank, the spacer, the second color filter, and the overcoat layer of the main area MA is present in the bent area BA.

A fourth row of table 1 corresponds to an example in which a stack of 7 organic layers respectively extending from the first planarization layer, the second planarization layer, the bank, the spacer, the light-blocking member, the second color filter, and the overcoat layer of the main area MA is present in the bent area BA.

A fifth row of table 1 corresponds to an example in which a stack of 6 organic layers respectively extending from the first planarization layer, the second planarization layer, the bank, the spacer, the light-blocking member, the third color filter, and the overcoat layer of the main area MA is present in the bent area BA.

A sixth row of table 1 corresponds to an example in which a stack of 5 organic layers respectively extending from the first planarization layer, the second planarization layer, the first color filter, the second color filter, and the overcoat layer of the main area MA is present in the bent area BA.

A seventh row of table 1 corresponds to an example in which a stack of 5 organic layers respectively extending from the first planarization layer, the second planarization layer, the second color filter, the third color filter, and the overcoat layer of the main area MA is present in the bent area BA.

An eighth row of table 1 corresponds to an example in which a stack of 6 organic layers respectively extending from the first planarization layer, the second planarization layer, the light-blocking member, the first color filter, the third color filter, and the overcoat layer of the main area MA is present in the bent area BA.

A ninth row of table 1 corresponds to an example in which a stack of 5 organic layers respectively extending from the bank, the spacer, the first color filter, the second color filter and the overcoat layer of the main area MA is present in the bent area BA.

A tenth row of table 1 corresponds to an example in which a stack of 5 organic layers respectively extending from the bank, the spacer, the second color filter, the third color filter and the overcoat layer of the main area MA is present in the bent area BA.

An eleventh row of table 1 corresponds to an example in which a stack of 6 organic layers respectively extending from the bank, the spacer, the light-blocking member, the first color filter, the third color filter and the overcoat layer of the main area MA is present in the bent area BA. Other rows of table 1 may also be interpreted in this way. As may be identified from table 1, various stacks of 3 to 7 organic layers based on various combinations of the organic layers in the main area MA may be present in the bent area BA.

Hereinafter, a pattern of an organic layer is described with reference to FIGS. 20A to 23C.

FIGS. 20A to 20D are respectively schematic plan views of a bent area having a line shaped pattern according to an embodiment.

Figure 20A:
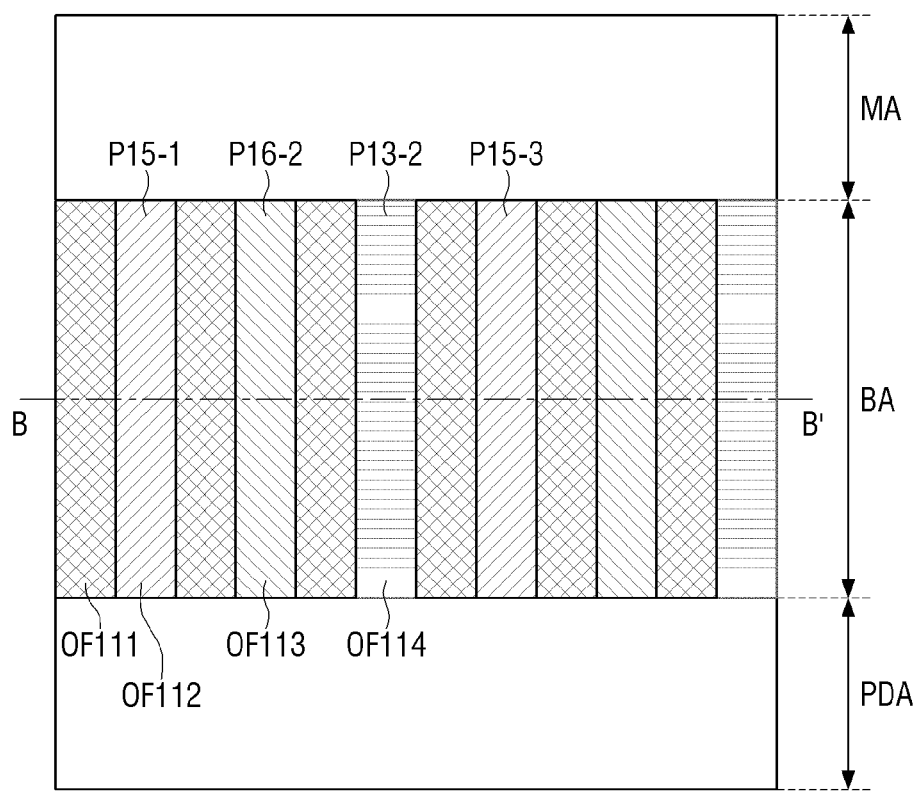
FIG. 20A to FIG. 20D are respectively schematic plan views of a bent area having a line shaped pattern according to an embodiment.

Referring to FIG. 20A, the bent area BA may include at least a first organic layer OF111, a second organic layer OF112, a third organic layer OF113 and a fourth organic layer OF114. Each of the first organic layer OF111, the second organic layer OF112, the third organic layer OF113 and the fourth organic layer OF114 has line shaped patterns.

The first organic layer OF111 may be an organic layer extending from the light-blocking member BM of the main area MA. The second organic layer OF112 may be an organic layer extending from the first planarization layer 180 in the main area MA. The third organic layer OF113 may be an organic layer extending from the first color filter CF1 in the main area MA. The fourth organic layer OF114 may be an organic layer extending from the second color filter CF2 in the main area MA.

Figure 20B:
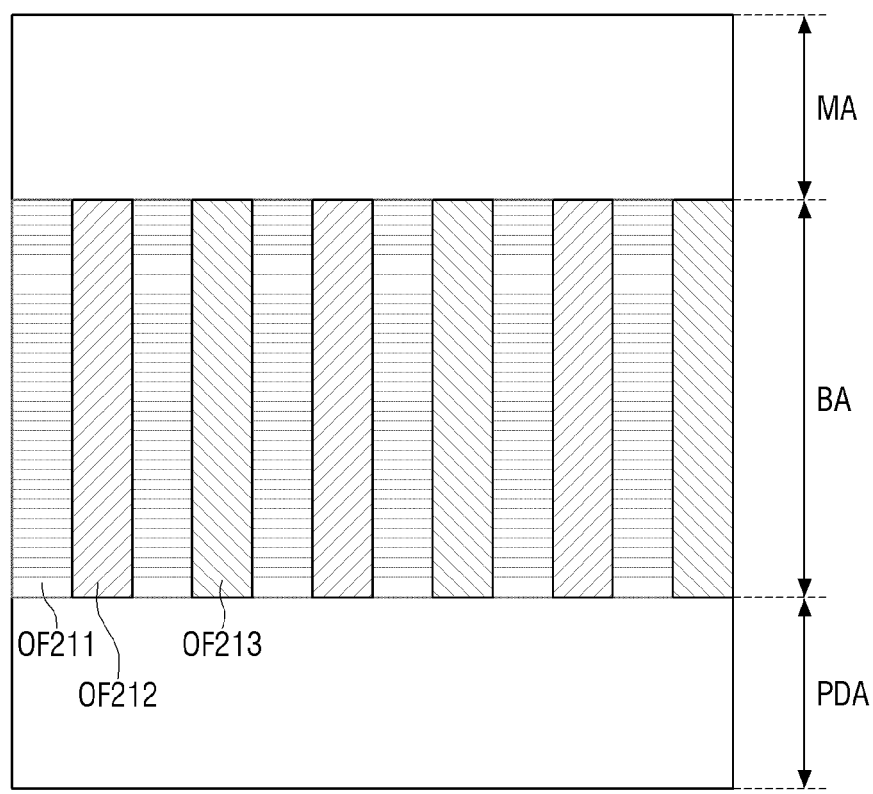

Referring to FIG. 20B, the bent area BA may include at least a first organic layer OF211, a second organic layer OF212 and a third organic layer OF213. Each of the first organic layer OF211, the second organic layer OF212 and the third organic layer OF213 has line shaped patterns.

The first organic layer OF211, the second organic layer OF212 and the third organic layer OF213 may be organic layers extending from the first planarization layer 160, the first color filter CF1 and the third color filter CF3 of the main area MA, respectively.

Figure 20C:
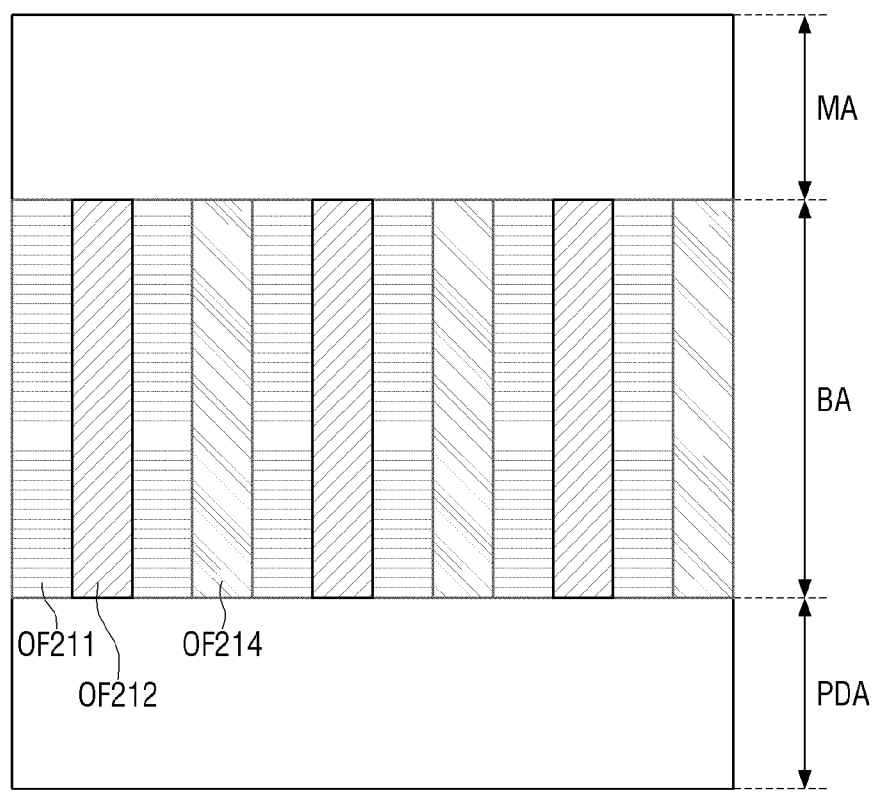

Referring to FIG. 20C, the bent area BA may include at least a first organic layer OF211, a second organic layer OF212 and a third organic layer OF214. Each of the first organic layer OF211, the second organic layer OF212 and the third organic layer OF214 has line shaped patterns.

The first organic layer OF211, the second organic layer OF212 and the third organic layer OF214 may be organic layers extending from the first planarization layer 160, the first color filter CF1 and the second color filter CF2 of the main area MA, respectively.

Figure 20D:
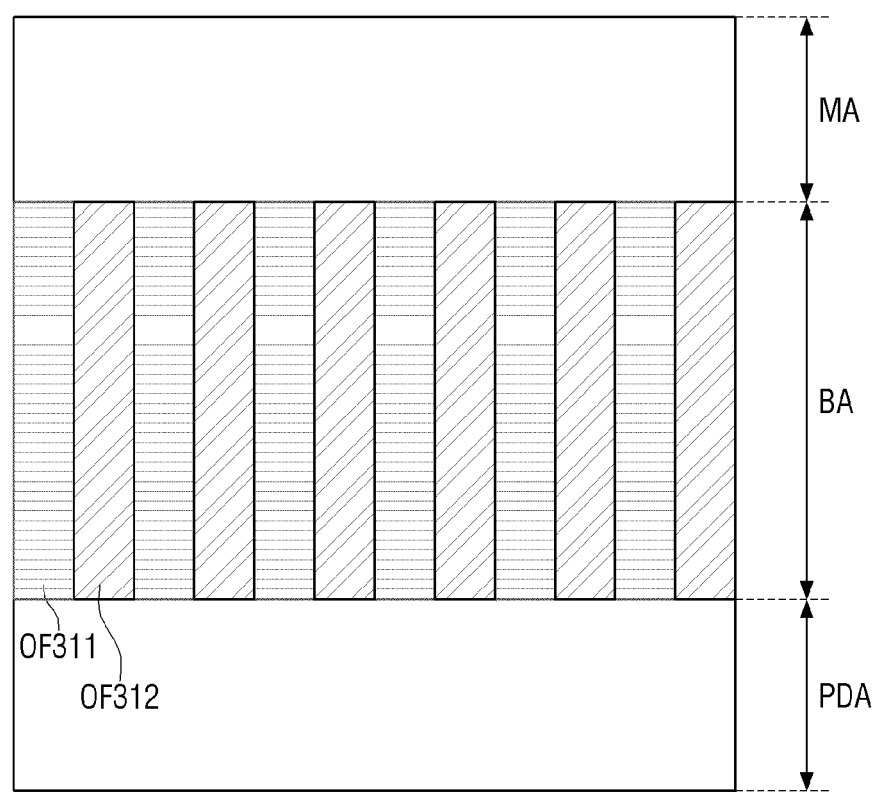

Referring to FIG. 20D, the bent area BA may include at least a first organic layer OF311 and a second organic layer OF312. Each of the first organic layer OF311 and the second organic layer OF312 has line shaped patterns.

The first organic layer OF311 and the second organic layer OF312 may be organic layers extending from the first planarization layer 160 and the second planarization layer 180 of the main area MA, respectively.

FIGS. 21A to 21D are respectively schematic plan views of a bent area having patterns having a checkerboard shape according to an embodiment.

Figure 21A:
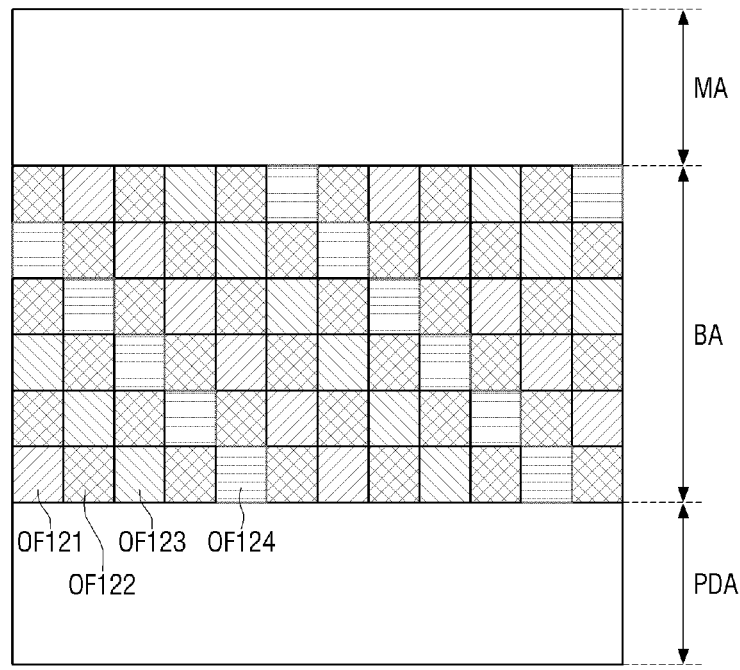
FIG. 21A to FIG. 21D are respectively schematic plan views of a bent area having patterns arranged in a checkerboard manner according to an embodiment.

Referring to FIG. 21A, the bent area BA may include at least a first organic layer OF121, a second organic layer OF122, a third organic layer OF123 and a fourth organic layer OF124. Each of the first organic layer OF121, the second organic layer OF122, the third organic layer OF123 and the fourth organic layer OF124 has patterns arranged in a checkerboard manner.

The first organic layer OF121, the second organic layer OF122, the third organic layer OF123 and the fourth organic layer OF124 may be organic layers extending from the blocking member BM, the first planarization layer 160, the first color filter CF1 and the third color filter CF3 of the main area MA, respectively.

Figure 21B:
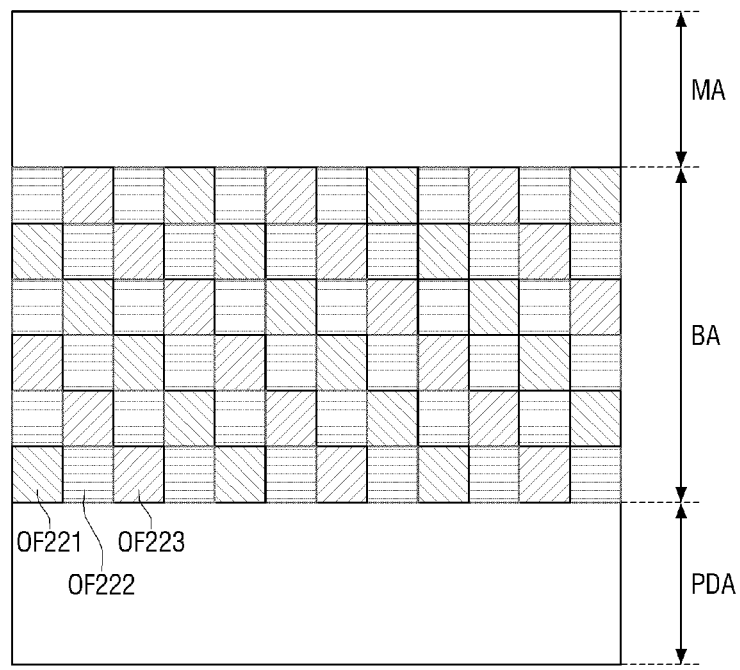

Referring to FIG. 21B, the bent area BA may include at least a first organic layer OF221, a second organic layer OF222 and a third organic layer OF223. Each of the first organic layer OF221, the second organic layer OF222 and the third organic layer OF223 has patterns arranged in a checkerboard manner.

The first organic layer OF221, the second organic layer OF222 and the third organic layer OF223 may be organic layers extending from the first planarization layer 160, the first color filter CF1 and the third color filter CF3 of the main area MA, respectively.

Figure 21C:
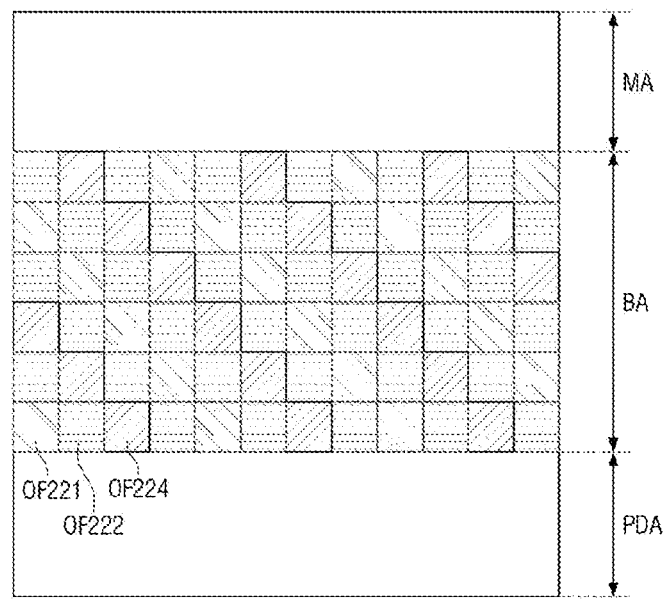

Referring to FIG. 21C, the bent area BA may include at least a first organic layer OF221, a second organic layer OF222 and a third organic layer OF224. Each of the first organic layer OF221, the second organic layer OF222 and the third organic layer OF224 has patterns arranged in a checkerboard manner.

The first organic layer OF221, the second organic layer OF222 and the third organic layer OF224 may be organic layers extending from the first planarization layer 160, the first color filter CF1 and the second color filter CF2 of the main area MA, respectively.

Figure 21D:
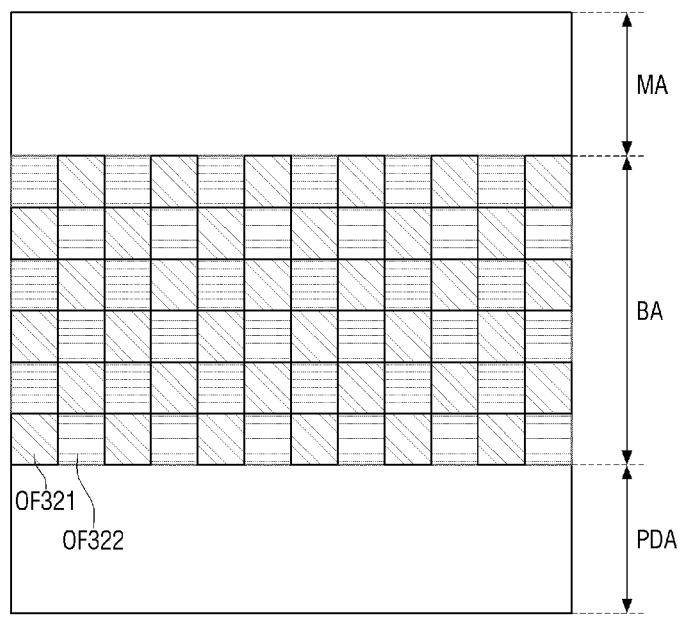

Referring to FIG. 21D, the bent area BA may include at least a first organic layer OF321 and a second organic layer OF322. Each of the first organic layer OF321 and the second organic layer OF322 has patterns arranged in a checkerboard manner.

The first organic layer OF321 and the second organic layer OF322 may be organic layers extending from the first planarization layer 160 and the second planarization layer 180 of the main area MA, respectively.

Figure 22A:
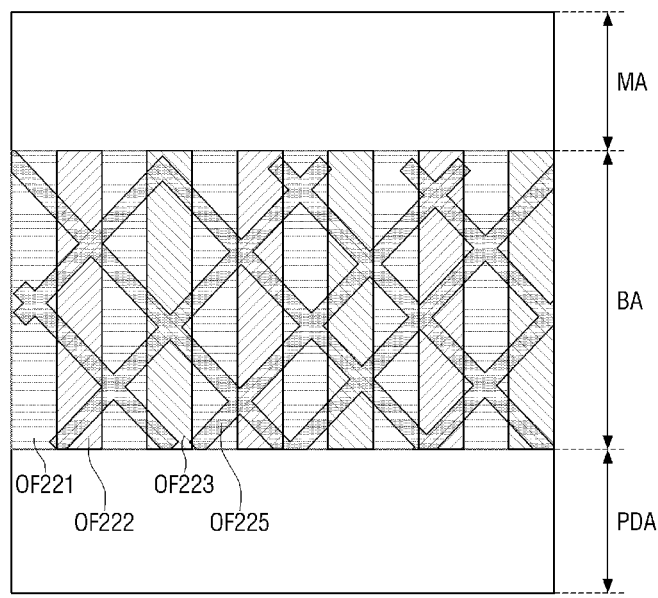
FIG. 22A to FIG. 22C are respectively schematic plan views of a bent area having line shaped patterns, and patterns extending in a diagonal manner according to an embodiment.
Figure 22B:
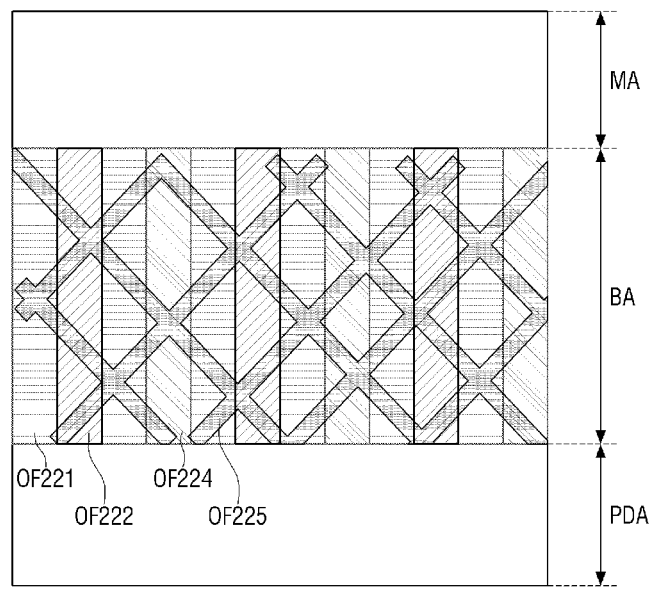
Figure 22C:
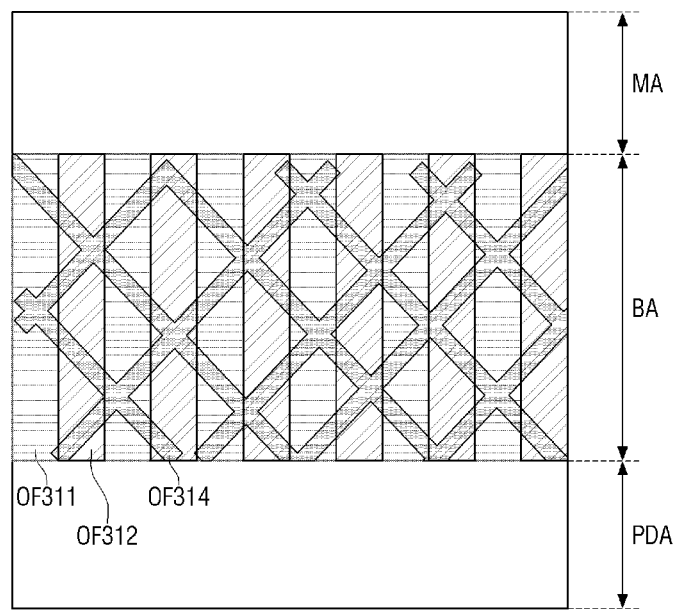

FIGS. 22A to 22C are respectively schematic plan views of a bent area having line shaped patterns, and patterns extending in a diagonal manner according to an embodiment.

Referring to FIG. 22A, the bent area BA may include at least a first organic layer OF221, a second organic layer OF222, a third organic layer OF223 and a fourth organic layer OF225. Each of the first organic layer OF221, the second organic layer OF222, and the third organic layer OF223 has line shaped patterns. The fourth organic layer OF225 has patterns extending in a diagonal manner.

The first organic layer OF221, the second organic layer OF222, the third organic layer OF223 and the fourth organic layer OF225 may be organic layers extending from the first planarization layer 160, the first color filter CF1, the third color filter CF3 and the light-blocking member BM in the main area MA, respectively.

Referring to FIG. 22B, the bent area BA may include at least a first organic layer OF221, a second organic layer OF222, a third organic layer OF224 and a fourth organic layer OF225. Each of the first organic layer OF221, the second organic layer OF222, and the third organic layer OF224 has line shaped patterns. The fourth organic layer OF225 has patterns extending in a diagonal manner.

The first organic layer OF221, the second organic layer OF222, the third organic layer OF224 and the fourth organic layer OF225 may be organic layers extending from the first planarization layer 160, the first color filter CF1, the second color filter CF2 and the light-blocking member BM in the main area MA, respectively.

Referring to FIG. 22C, the bent area BA may include at least a first organic layer OF311, a second organic layer OF312 and a third organic layer OF314. Each of the first organic layer OF311 and the second organic layer OF312 has line shaped patterns. The third organic layer OF314 has patterns extending in a diagonal manner.

The first organic layer OF311 and the second organic layer OF312 may be organic layers extending from the first planarization layer 160 and the second planarization layer 180 of the main area MA, respectively.

Figure 23A:
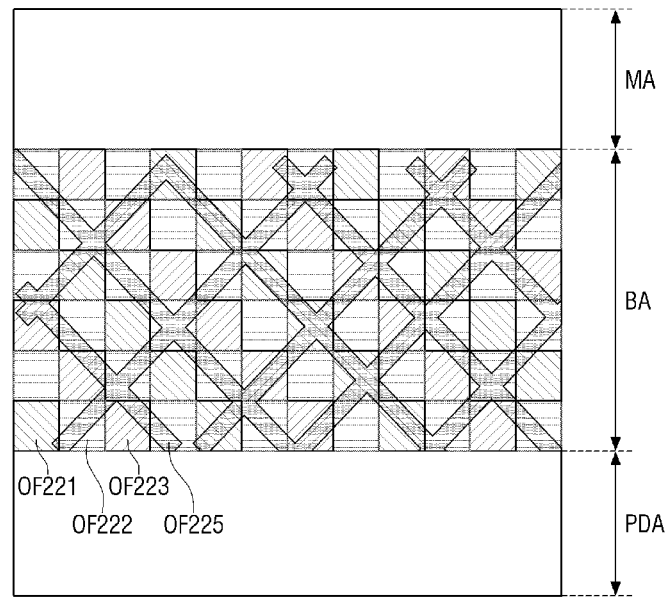
FIG. 23A to FIG. 23C are respectively plan views of a bent area having patterns arranged in a checkerboard manner and patterns extending in a diagonal manner according to an embodiment.
Figure 23B:
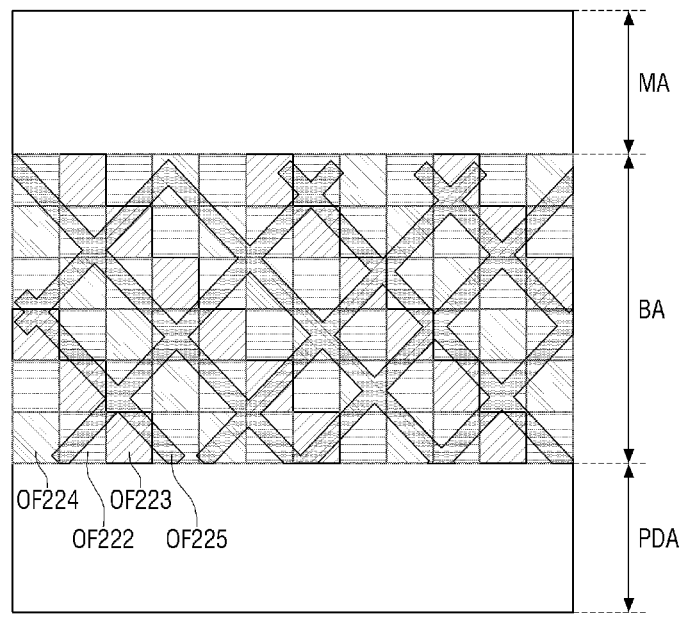
Figure 23C:
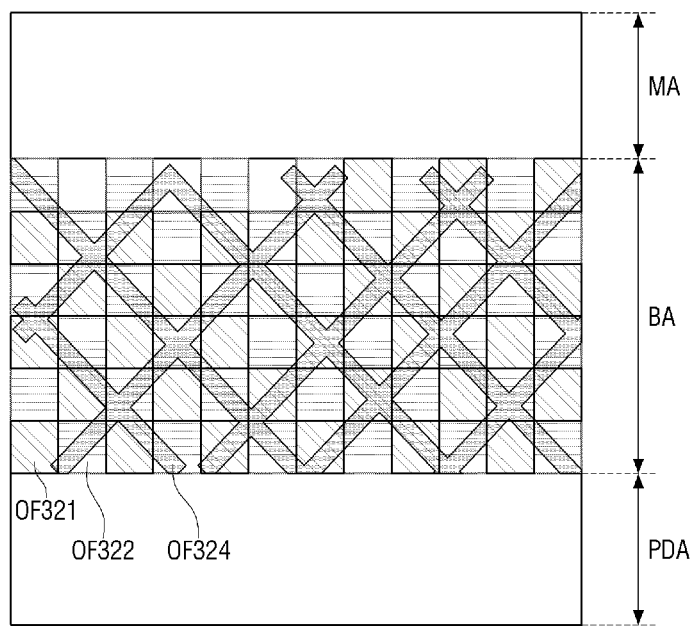

FIGS. 23A to 23C are respectively schematic plan views of a bent area having patterns arranged in a checkerboard manner and patterns extending in a diagonal manner according to an embodiment.

Referring to FIG. 23A, the bent area BA may include at least a first organic layer OF221, a second organic layer OF222, a third organic layer OF223 and a fourth organic layer OF225. Each of the first organic layer OF221, the second organic layer OF222, and the third organic layer OF223 has patterns arranged in a checkerboard manner. The fourth organic layer OF225 has patterns extending in a diagonal manner.

The first organic layer OF221, the second organic layer OF222, the third organic layer OF223 and the fourth organic layer OF225 may be organic layer extending from the first planarization layer 160, the first color filter CF1, the third color filter CF3, and the blocking member BM of the main area MA, respectively.

Referring to FIG. 23B, the bent area BA may include at least a first organic layer OF224, a second organic layer OF222, a third organic layer OF223 and a fourth organic layer OF225. Each of the first organic layer OF224, the second organic layer OF222 and the third organic layer OF223 has patterns arranged in a checkerboard manner. The fourth organic layer OF225 has patterns extending in a diagonal manner.

The first organic layer OF224, the second organic layer OF222, the third organic layer OF223 and the fourth organic layer OF225 may be organic layers extending from the first planarization layer 160, the first color filter CF1, the third color filter CF3 and the blocking member BM in the main area MA, respectively.

Referring to FIG. 23C, the bent area BA may include at least a first organic layer OF321, a second organic layer OF322 and a third organic layer OF324. Each of the first organic layer OF321 and the second organic layer OF322 has patterns arranged in a checkerboard manner. The third organic layer OF324 has patterns extending in a diagonal manner.

The first organic layer OF321, the second organic layer OF322 and the third organic layer OF324 may be organic layers extending from the first planarization layer 160, the second planarization layer 180 and the blocking member BM of the main area MA, respectively.

The shape or the number of the patterns of each of the organic layers is not limited to those in the drawings and may be modified in various embodiments.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
    a display area and a non-display area, the non-display area including a bent area having a radius of curvature;
    a transistor layer disposed in the display area and including a transistor and a signal line; and
    a stack of a plurality of first area organic layers disposed in the transistor layer, wherein
    the bent area includes:
        a line layer including a connection line; and
        a stack of a plurality of second area organic layers disposed on the line layer, the connection line is electrically connected to the signal line,
    the plurality of second area organic layers respectively extends from the plurality of first area organic layers.

2. The device of claim 1, further comprising:
    a light-emitting element layer disposed on the transistor layer;
    a thin-film encapsulation layer disposed on the light-emitting element layer; and
    an overcoat layer disposed on the thin-film encapsulation layer.

3. The device of claim 1, wherein
    the transistor layer includes:
        an insulating layer; and
        at least one organic planarization layer disposed on the insulating layer and respectively corresponding to at least one layer, and
    the plurality of first area organic layers include the at least one organic planarization layer.

4. The device of claim 2, wherein
    the light-emitting element layer includes a pixel defining film and a spacer, and
    the plurality of first area organic layers include at least one of the pixel defining film or the spacer.

5. The device of claim 2, wherein the plurality of first area organic layers include the overcoat layer.

6. The device of claim 2, further comprising:
    a color filter layer disposed between the thin-film encapsulation layer and the overcoat layer.

7. The device of claim 6, wherein the color filter layer includes:
    a first color filter transmitting light in a first wavelength range;
    a second color filter transmitting light in a second wavelength range; and
    a third color filter transmitting light in a third wavelength range.

8. The device of claim 6, further comprising:
    a light-blocking member disposed under the color filter layer,
    wherein the light-blocking member includes an organic insulating material including at least one of black resin or white resin.

9. The device of claim 1, wherein a neutral plane is located in the line layer.

10. The device of claim 1, wherein the stack of the plurality of second area organic layers has a thickness in a range of about 10 μm to about 12 μm.

11. The device of claim 1, wherein each of the plurality of second area organic layers has a plurality of patterns.

12. The device of claim 11, wherein the plurality of patterns are arranged in a linear manner, a diagonal manner, and/or a checkerboard manner in a plan view of the device.

13. The device of claim 11, wherein each of the plurality of second area organic layers has a through-hole between adjacent ones of the plurality of patterns.

14. The device of claim 13, wherein
    the plurality of second area organic layers include:
        a first organic layer;
        a second organic layer disposed on the first organic layer; and
        a third organic layer disposed on the second organic layer,
    the first organic layer has a plurality of patterns, and has a first through-hole formed between adjacent ones of the plurality of patterns of the first organic layer, and a second through-hole between adjacent ones of the plurality of patterns of the first organic layer, and
    the second organic layer has a plurality of patterns, and has a third through-hole formed between adjacent ones of the plurality of patterns of the second organic layer.

15. The device of claim 14, wherein
    the first through-hole does not overlap the third through-hole, and
    the first through-hole is filled with the second organic layer.

16. The device of claim 15, wherein
    the second through-hole overlaps the third through-hole, and
    the second through-hole and the third through-hole are filled with the third organic layer.

17. A display device comprising:
    a display area and a non-display area, the non-display area including a bent area having a radius of curvature;
    a transistor layer disposed in the display area and including a transistor and a signal line;

a light-emitting element layer disposed on the transistor layer;
a thin-film encapsulation layer disposed on the light-emitting element layer; and
an overcoat layer disposed on the thin-film encapsulation layer, wherein
the bent area includes:
  a line layer including a connection line; and
  a stack of a plurality of organic layers disposed on the line layer, and
the plurality of organic layers respectively extend from at least two of the transistor layer, the light-emitting element layer, the thin-film encapsulation layer or the overcoat layer.

18. The device of claim 17, further comprising:
a color filter layer disposed between the thin-film encapsulation layer and the overcoat layer,
wherein the color filter layer includes an organic insulating material including at least one of black resin and white resin.

19. The device of claim 18, wherein a neutral plane is located in the line layer.

20. The device of claim 17, wherein each of the plurality of organic layers has a plurality of patterns.

* * * * *